(12) United States Patent
Magland et al.

(10) Patent No.: US 7,166,998 B2
(45) Date of Patent: Jan. 23, 2007

(54) EXACT HALF PULSE SYNTHESIS VIA THE INVERSE SCATTERING TRANSFORM

(75) Inventors: Jeremy Magland, Lansdale, PA (US); Charles L. Epstein, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 34 days.

(21) Appl. No.: 11/010,543

(22) Filed: Dec. 13, 2004

(65) Prior Publication Data

US 2005/0127911 A1    Jun. 16, 2005

Related U.S. Application Data

(60) Provisional application No. 60/529,363, filed on Dec. 12, 2003.

(51) Int. Cl.
*G01V 3/00* (2006.01)
(52) U.S. Cl. .................................... 324/307
(58) Field of Classification Search ................ 324/307
See application file for complete search history.

(56) References Cited

U.S. PATENT DOCUMENTS 4,868,501 A * 9/1989 Conolly ...................... 324/309

OTHER PUBLICATIONS

Nielson H et al., "Ultra-Short Echo-Time 2D Time-of-Flight MR Angiography Using a Half-Pulse Excitation", Mag Reson Med 41:591-599 (1999).*

Shinnar M, "Reduced Power Selective Excitation Radio Frequency Pulses", Mag Reson Med 32(5):658-660 (1994).*

Buonocore M, "RF Pulse Design using the Inverse Scattering Transform", Mag Reson Med 29(4):470-477 (1993).*

Berger, M.S., "Nonlinearity and functional analysis: lectures on nonlinear problems in mathematical analysis," *Academic Press, NY*, 1977, 112-115.

Conolly, S., et al., "Variable-rate selective excitation," *J. of Mag. Res.*, 1988, 78, 440-458.

Epstein, C.L., "Minimum power pulse synthesis via the inverse scattering transform," *J. of Mag. Res.*, 2004, 167, 185-210.

Epstein, C.L., et al., "Patent disclosure for exact half pulse synthesis via the inverse scattering transform," *Univ. of Penn., Dept. of Mathematics*, Revised Dec. 3, 2004, 1-15.

Magland, J., et al., "Exact half pulse synthesis via the inverse scattering transform," *J. of Mag. Res.*, 2004, 171, 305-313.

(Continued)

*Primary Examiner*—Brij Shrivastav
*Assistant Examiner*—Megann Vaughn
(74) *Attorney, Agent, or Firm*—Woodcock Washburn LLP

(57) ABSTRACT

A method of obtaining an arbitrary, admissible transverse magnetization profile as the summed response of two, self refocused selective "half pulse" excitations for use in, e.g., magnetic resonance imaging pulse generation. The problem of finding the pair of half pulses is rephrased in the inverse scattering formalism and a simple closed form algorithm for the solution is given, provided the target transverse profile has constant phase (modulo 180°). The problem has a unique low energy solution for sufficiently small, complex valued data, and an algorithm for finding the solution is provided. This solution is used to generate pairs of half pulses for given target transverse profiles.

14 Claims, 19 Drawing Sheets

OTHER PUBLICATIONS

Magland, J., et al., "Practical pulse synthesis via the discrete inverse scattering transform," *J. of Mag. Res.*, 2004, 172, 63-78.

Nielson, H.T.C., et al., "Ultra-short echo-time 2D time-of-flight MR angiography using a half-pulse excitation," *Mag. Res. in Medicine*, 1999, 41, 591-599.

Rourke, D.E., et al., "The inverse scattering transform and its use in the exact inversion of the Bloch equation for noninteracting spins," *J. of Mag. Res.*, 1992, 99, 1-20.

Yagle, A.E., "Inversion of the Bloch transform in magnetic resonance imaging using asymmetric two component inverse scattering," *Inverse Problems*, 1990, 6, 133-151.

U.S. Appl. No. 60/433,407, filed Dec. 13, 2002, Epstein.

U.S. Appl. No. 10/734,799, filed Dec. 12, 2003, Epstein.

* cited by examiner

EXACT HALF PULSE SYNTHESIS VIA THE INVERSE SCATTERING TRANSFORM

CROSS REFERNCE TO RELATED APPLICATIONS

This application claims the benefit of U.S. Ser. No. 60/529,363 filed Dec. 12, 2003, which is incorporated herein by reference as if reproduced in its entirety.

GOVERNMENT SUPPORT

The present invention was supported by the National Science Foundation under Grant Nos. NSF DMS02-03075. The government may have certain rights in the invention.

FIELD OF THE INVENTION

The present invention relates to a method of obtaining an arbitrary, admissible transverse magnetization profile as the summed response of two, self refocused selective "half pulse" excitations for use with ensembles of two state quantum systems, e.g., magnetic resonance imaging pulse generation and certain laser optics systems.

BACKGROUND OF THE INVENTION

In many MR-applications it is useful to be able to shorten the excitation time and begin acquiring a signal as soon after the RF-excitation as possible. In particular, one would like to reduce the rephasing time, essentially to 0. This is especially important when imaging very short $T_2$-species. The possibility of using two "half pulses" is explored by Nielson et al. in "Ultra-short echo-time 2D time-of-flight MR angiography using a half-pulse excitation," Mag. Res. in Medicine, Vol. 41 (1999), pp. 591–599. The idea is to use two excitations, neither of which requires rephrasing, so that the summation of these two independent measurements equals the result of using a single excitation, which would require rephasing.

More precisely, Nielson et al. consider whether, given a summed selective excitation transverse profile, herein referred to as a target transverse profile $(m_x+im_y)(f)$, one can find a pair of self refocused pulses $q_1$ and $q_2$ with transverse magnetization profiles, $(m_x^1+im_y^1)(f)$, $(m_x^2+im_y^2)(f)$, so that:

$$(m_x+im_y)(f)=[(m_x^1+im_y^1)(f)+(m_x^2+im_y^2)(-f)]. \qquad (1)$$

By "self refocused" it is meant that, at the conclusion of the RF-pulse, the magnetization achieves the stated transverse profile, without any need for rephasing. The pair $(q_1, q_2)$ are called a pair of half pulses.

Assuming the possibility of instantaneously switching the gradient fields, such a pair of half pulses would be used in an MR-experiment as follows. With the slice select gradient turned on, the sample is first excited using the profile $q_1$. At the conclusion of the excitation, the slice select gradient is immediately turned off, and the signal $S_1(t)$ is acquired. Once the system has returned to equilibrium, the slice select gradient is again turned on, but with the polarity reversed. The sample is excited using the profile $q_2$. At the conclusion of this excitation, the slice select gradient is again immediately turned off, and the signal $S_2(t)$ is acquired.

Let q denote the (minimum energy) pulse which, after appropriate rephasing produces the target excitation. Ignoring noise and relaxation effects, it is not difficult to see that if the transverse magnetizations satisfy Equation (1), then the sum of the signals $(S_1+S_2)$ equals the signal that would be measured if one used a single excitation using the profile q, and started acquiring the signal after the appropriate rephasing. In light of the linearity of the measurement process, it is also clear that one can follow the excitations with phase, or frequency encoding steps, and the statement about the sum of the measured signals remains correct.

Due to the nonlinear dependence of the magnetization profile on the pulse envelope, the problem of finding the pair $(q_1, q_2)$, given $m_x+im_y$, is obviously nonlinear. The Nielson paper solves this problem to first order, using the low flip angle connection between the Fourier transform of the pulse envelope, and the transverse magnetization profile. This solution is adequate for very small target flip angles; however, for larger flip angles, the linear approximation has rather poor selectivity. An example of using the linear approximation to design a pair of half pulses which sum to produce a 90° flip as the summed target magnetization is shown in FIG. 1, where FIG. 1(a) illustrates half of a symmetric 90° pulse and FIG. 1(b) illustrates the transverse magnetization produced by using the pulse in FIG. 1(a) as a half pulse.

As will be explained in more detail below, the present inventors have found a way to reformulate the half pulse synthesis problem and exactly solve it using the inverse scattering mathematical formalism. In the natural time parameterization provided by the inverse scattering formalism, a pulse is self refocused if it is supported in $(-\infty,0]$, as noted by Rourke et al. in "The inverse scattering transform and its use in the exact inversion of the Bloch equation for noninteracting spins," Jour. of Mag. Res., Vol. 99 (1992), pp. 118–138, and by Epstein in "Minimum Power Pulse Synthesis Via the Inverse Scattering Transform," Jour. of Mag. Res., Vol. 167 (2004), pp. 185–210. In this time parameterization, the Fourier transforms of $q_1$ and $q_2$ would therefore have analytic continuations to the upper half plane. From the mathematical standpoint, the content of the Nielson paper is contained in the following classical theorem:

Theorem 1. Let $f \in L^2(R)$, then there are unique functions $f_1$, $f_2$ in $L^2(R)$ such that $f_1$ and $f_2$ have analytic extensions to the upper halfplane and $f(\xi)=f_1(\xi)+f_2(-\xi)$.

In the Nielson paper, various practical difficulties with implementing half pulses are discussed. For example, the pulses produced by either the linear or nonlinear theory produce considerable excitation outside the desired slice. The selectivity of the pair of pulses results from delicate cancellations between the out-of-slice contributions from the two excitations. A variety of phenomena, such as eddy currents, can lead to imperfect cancellation out-of-slice, in the sum of the measured signals. To attain a high degree of cancellation, Nielson, et al. found it necessary to measure the actual gradient fields, with the sample in place. Nielson, et al. then use a VeRSE technique to match the play out of the half pulses to the actual time course of the gradient.

The present invention provides a solution to the half pulse synthesis problem so that an arbitrary, admissible target transverse profile is producible as the summed response to two, self refocused selective "half pulse" excitations may be obtained for use in, e.g., magnetic resonance imaging pulse generation.

SUMMARY OF THE INVENTION

The present invention reformulates the half pulse synthesis problem as an inverse scattering problem and provides an algorithm for solving this problem. The resulting pulses produced by the method of the invention do not suffer from the loss of selectivity exhibited in the Nielson examples for the pulse pair designed using the linear approximation. On the contrary, in accordance with the method of the invention it is possible to design pairs of half pulses that will produce any desired admissible target transverse profile. Moreover, as the VeRSE technique used by Nielson et al. amounts to a change in the time parameterization in Bloch's equations and because the cancellation phenomenon is the result of a symmetry in Bloch's equation, the methods employed by Nielson et al. would work equally well with half pulses designed using the inverse scattering transform (IST) approach of the invention. With sufficiently good experimental technique, the improvements in the designed profiles should be reflected in the profiles obtained on a scanner.

The problem of finding the pair of half pulses is rephrased in the inverse scattering formalism and a simple closed form algorithm for the solution is given, provided the target transverse profile is real or, more generally, of constant phase modulo 180°. This is the case of principal interest in applications. It is also shown that the problem has a unique small energy solution for sufficiently small data with non-constant phase, and an algorithm for finding the solution is provided. This solution is used to generate pairs of half pulses for a given target transverse profile. In practice, this algorithm has been found to work well, even for fairly large data. The half pulse pairs for several target transverse profiles are provided. It is shown that pulses can be found that produce essentially the maximum possible summed amplitude of 2. This in turn allows the half pulse technique to be used to optimally increase the SNR: the summed signal has double the usual amplitude, while the noise is uncorrelated between the two half pulse excitations.

In particular, a method is described for synthesizing a pair of self refocused waveforms (e.g., RF pulses) for a given admissible target transverse profile. Such a method in accordance with the invention includes the steps of (1) determining first and second full profiles (e.g., in NMR, full magnetization profiles) each of which is producable by a self refocused pulse, where, at any given frequency, the sum of (a) the transverse part of the first profile and (b) the transverse part of the second profile at a frequency of opposite sign to the frequency used for the first profile, gives the given admissible target transverse profile at the given frequency, and (2) obtaining the pair of self refocused waveforms that respectively produce the first and second full profiles obtained in the full profiles determining step.

An admissible transverse target profile may be any complex valued function on the real line, with modulus less than 2, and sufficiently rapid decay for use in applications such as magnetic resonance imaging and NMR spectroscopy. In the case that the phase of the given target transverse profile is constant (modulo 180°), a plurality of the first and second full profiles may be produced by self refocused pulses using the relation:

$$r_1(\xi) = \frac{1 - s(\xi)}{1 + s(\xi)}.$$

Here $$\xi = \frac{f}{2}$$

is the natural spin domain off-set frequency parameter, r, is a reflection coefficient in the upper half plane, and $s(\xi)$ is a function that has a meromorphic extension to the upper half plane and tends to 1 as $|\xi|$ tends to infinity.

On the other hand, a target transverse profile may have non-constant phase and comprise any complex valued function taking values in a disk of radius less than two and decaying sufficiently rapidly for use in applications such as magnetic resonance imaging. In this case, the first and second full profiles are produced by approximating reflection coefficients determined by the first and second full profiles using iterations of a linear solution for the reflection coefficients until changes in the reflection coefficients become sufficiently small.

The method may be used to generate magnetic resonance imaging signals by applying the pair of self refocused waveforms synthesized in the synthesizing step to a magnetic resonance imaging system for given magnetization profiles so as to obtain an arbitrary, admissible target transverse profile as the summed response of two self refocused selective "half pulse" excitations. While the invention has been described in the language of MR imaging, those skilled in the art will realize that this method applies equally well to produce target transverse profiles in other applications of NMR as well as, in any physical system whose behavior can be modeled by the spin domain Bloch equation, as described in the Epstein paper referenced above.

BRIEF DESCRIPTION OF THE DRAWINGS

The aforementioned features of the invention will be more apparent from the following detailed description in connection with the figures, of which.

Figure 4A:
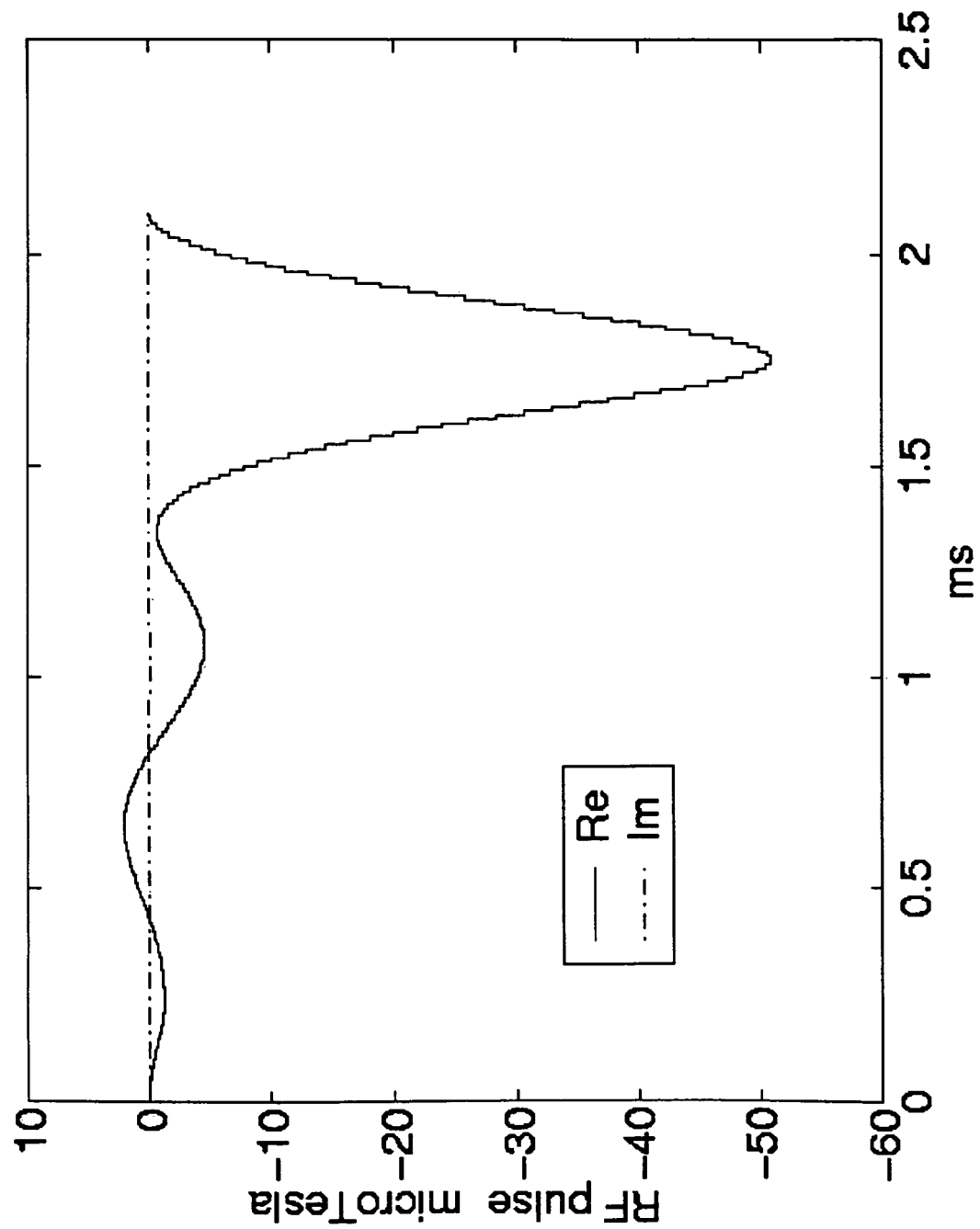
FIG. 4 illustrates the nonlinear half pulse used to obtain a maximum summed profile with a Blaschke factor included to reduce the out-of-slice imaginary part, where (a) is the half pulse, (b) is the summed transverse magnetization produced by using the pulse in FIG. 4(a) with $T_2=\infty$, and (c)
Figure 4B:
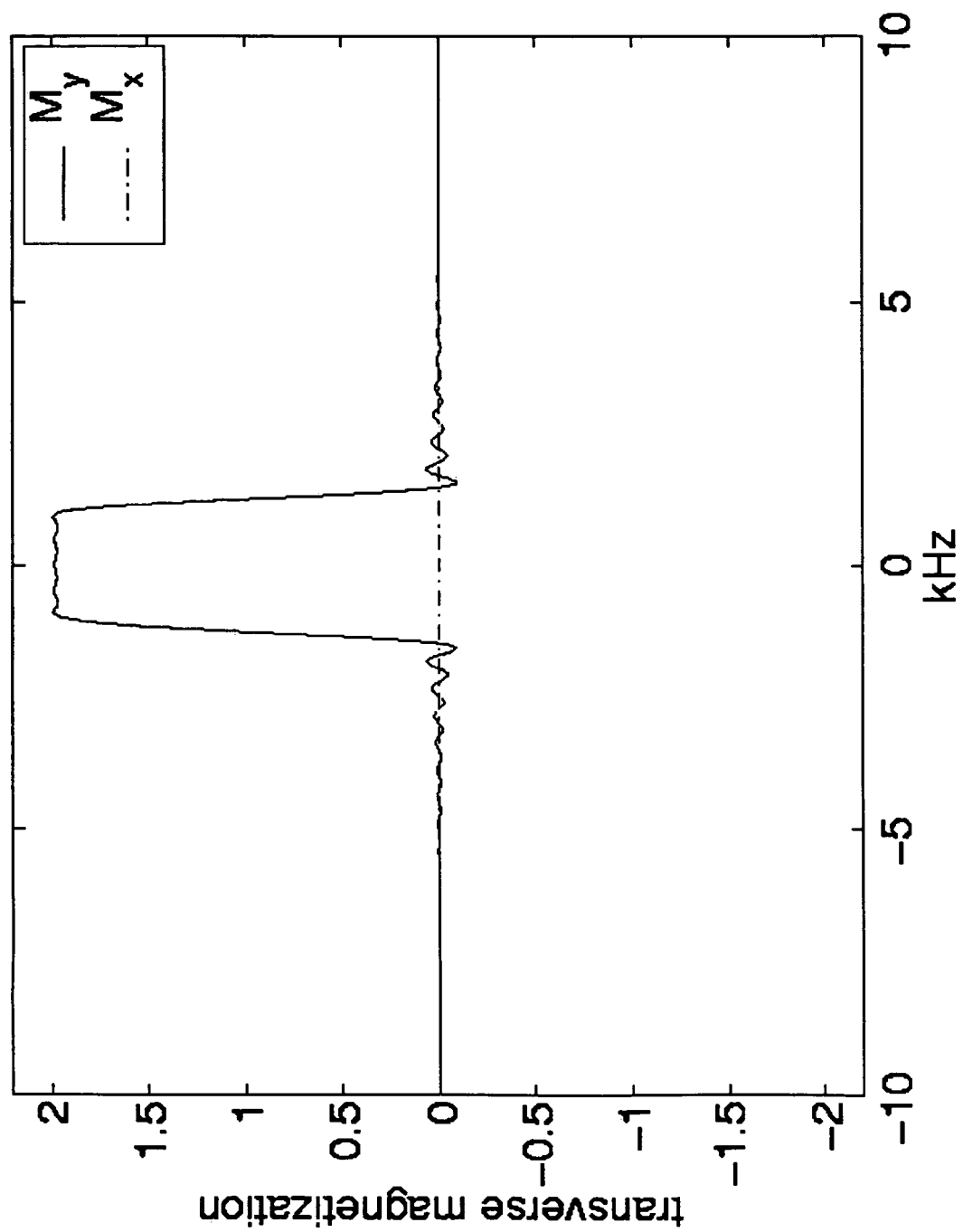

is the summed transverse magnetization produced by using the pulse of FIG. 4(a) with $T_2$=5 ms.

Figure 3A:
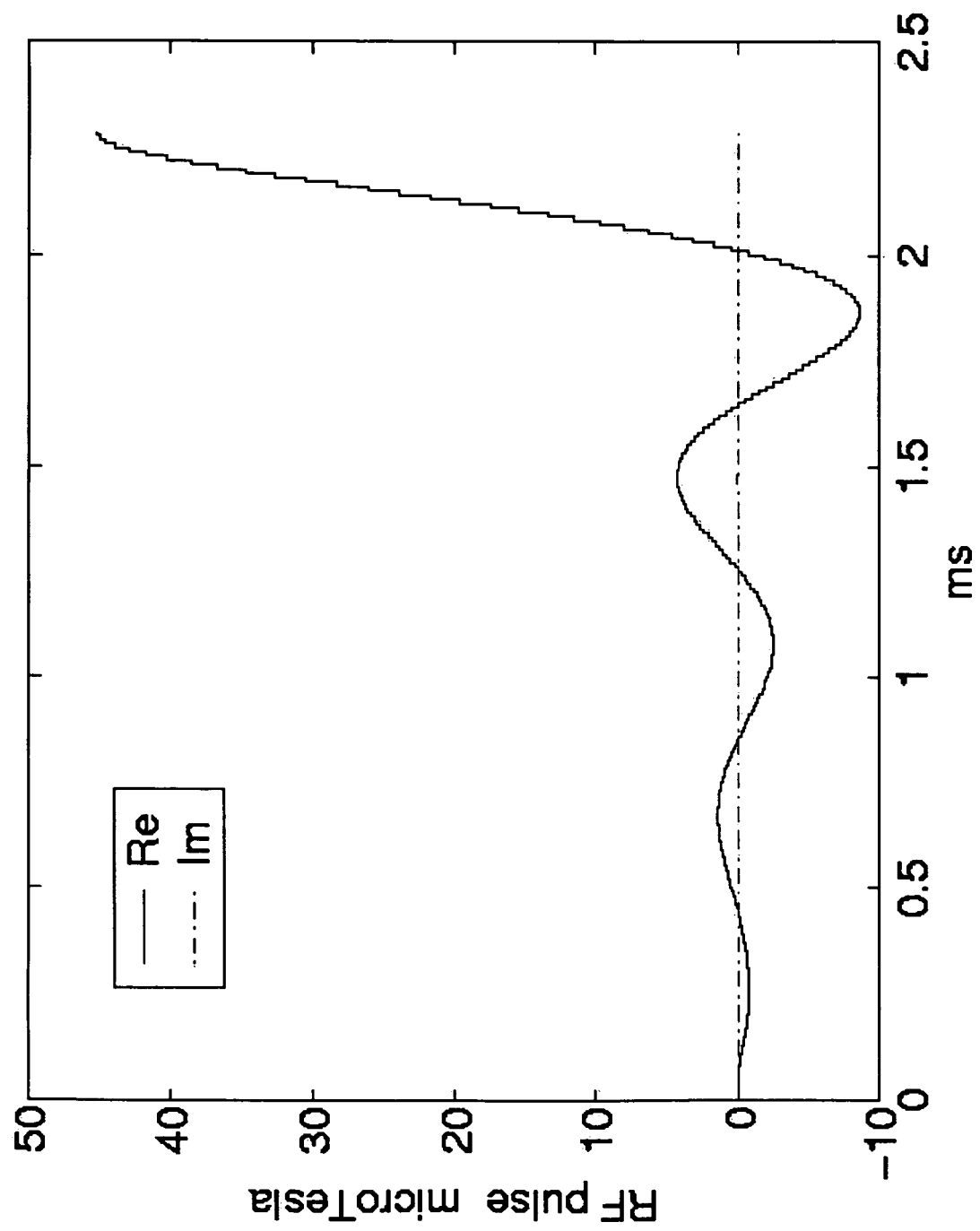
FIG. 3 illustrates the nonlinear half pulse used to obtain a maximum summed profile, where (a) is an IST half pulse, (b) is the summed transverse magnetization produced by using the pulse in FIG. 3(a) with $T_2=\infty$, and (c) is the summed transverse magnetization produced by using the pulse of FIG. 3(a) with $T_2=5$ ms.
Figure 5A:
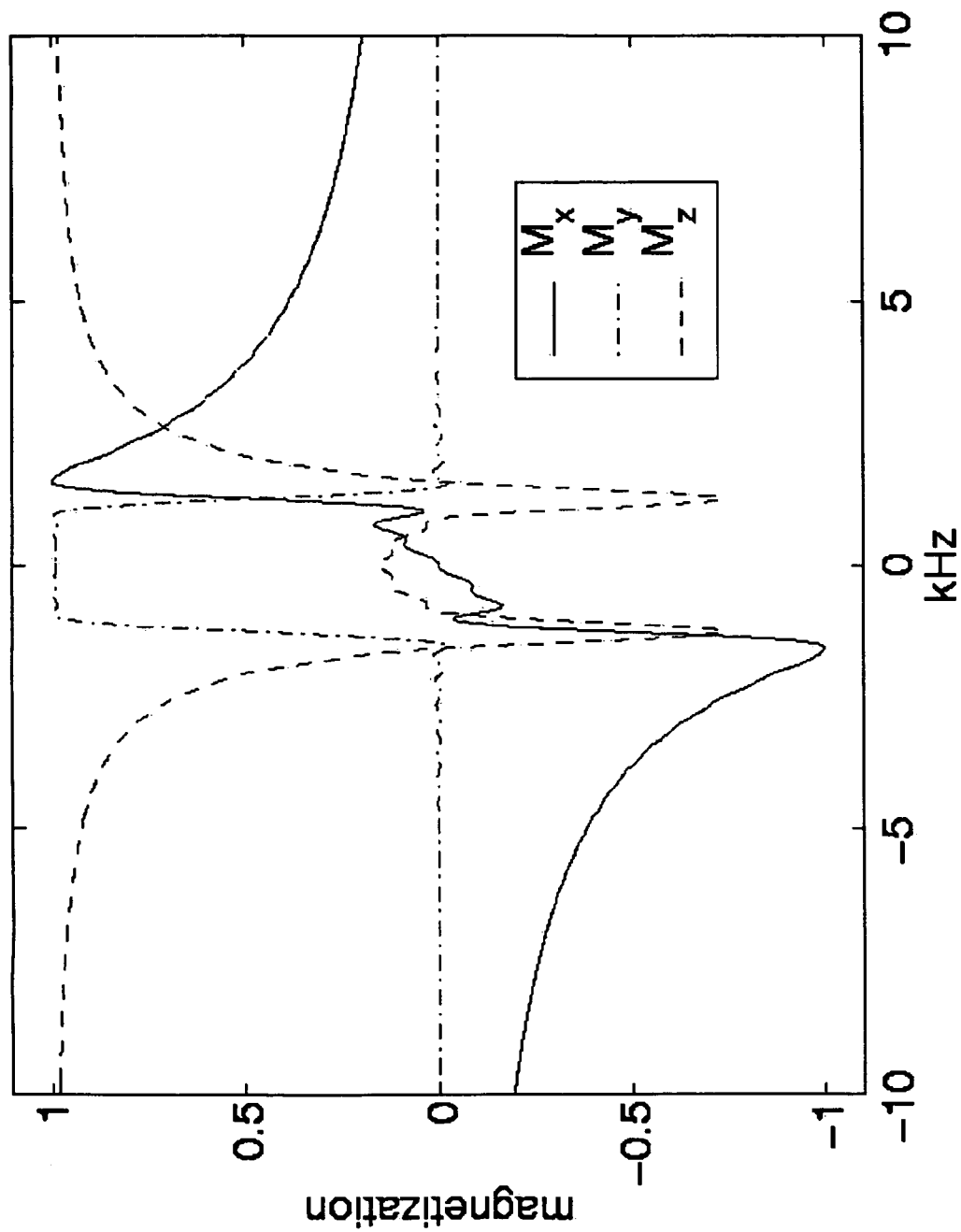
Figure 5B:
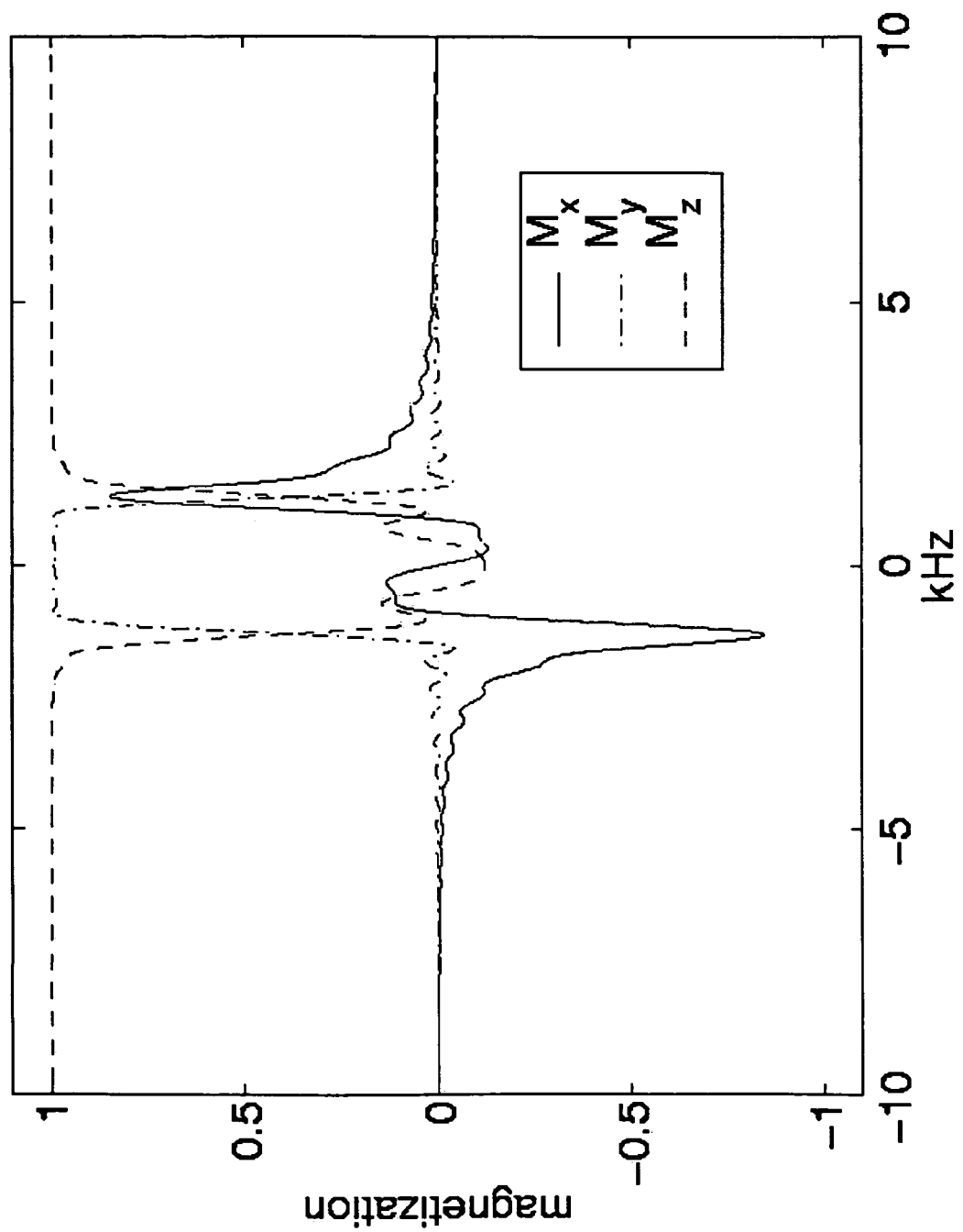

FIGS. 5(a) and 5(b) illustrate the unsummed magnetization profiles produced by two pulses designed using the IST method, where (a) is the magnetization profile produced by the pulse in FIG. 3(a) and (b) is the magnetization profile produced by the pulse in FIG. 4(a).

Figure 3B:
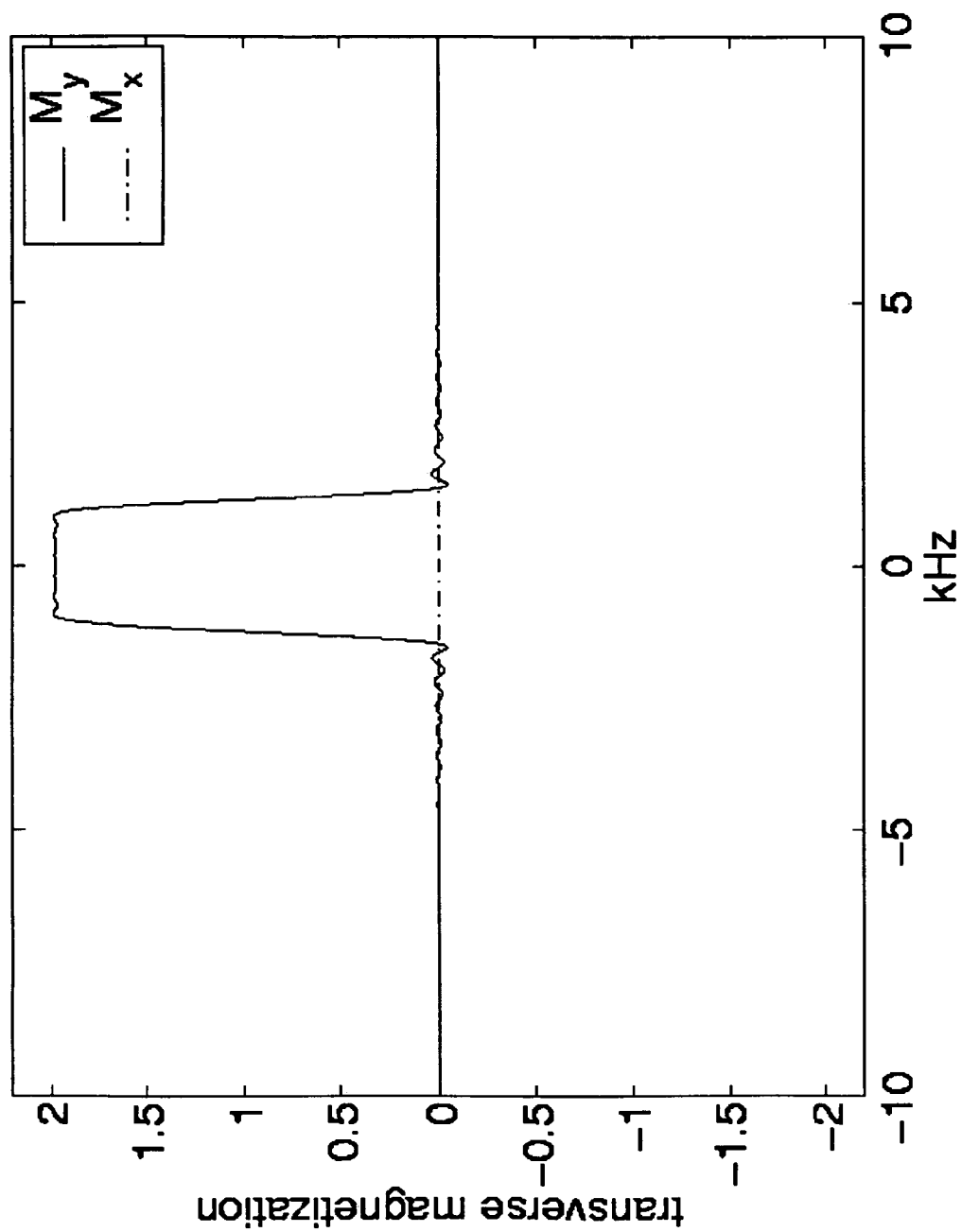
Figure 3C:
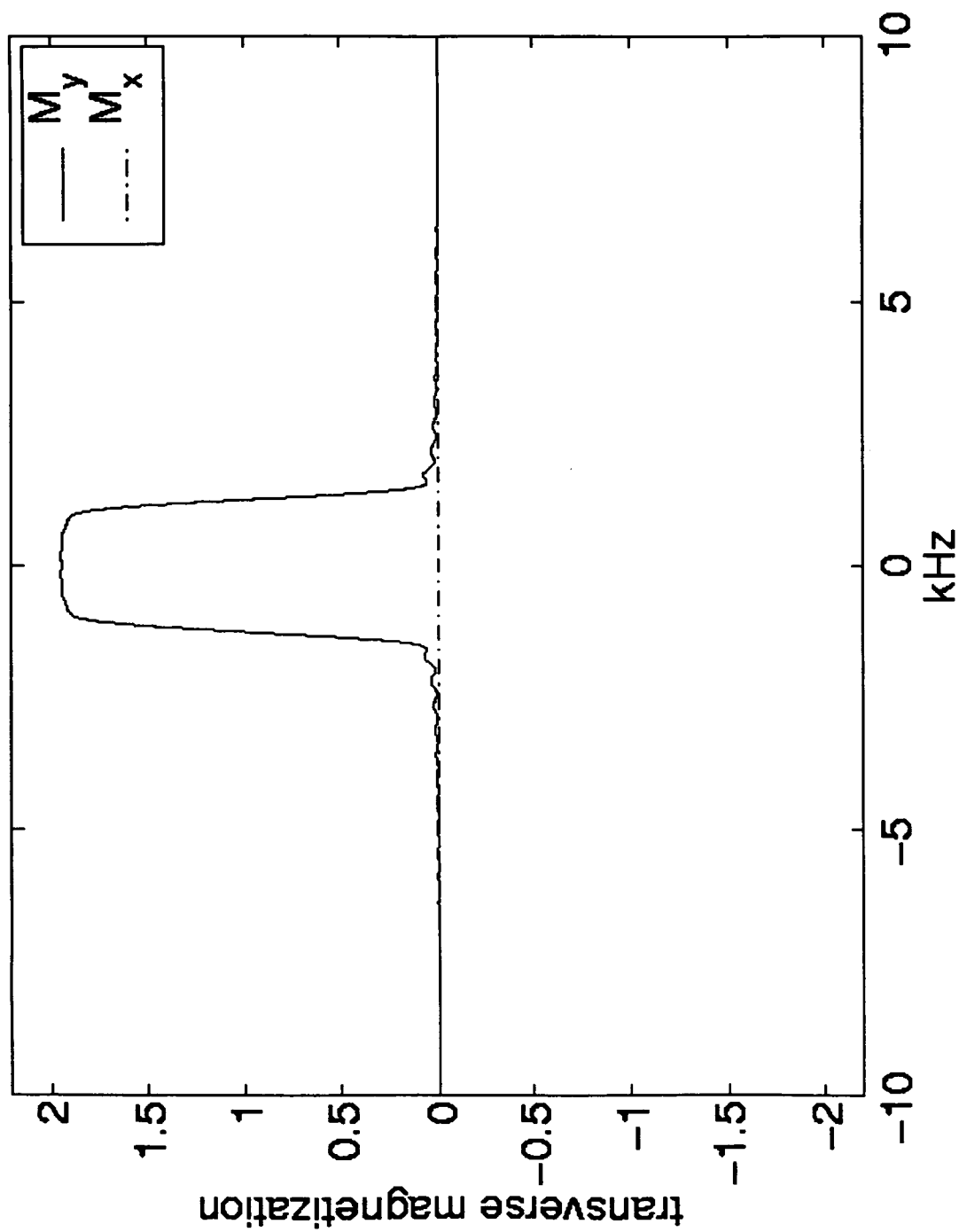
Figure 4C:
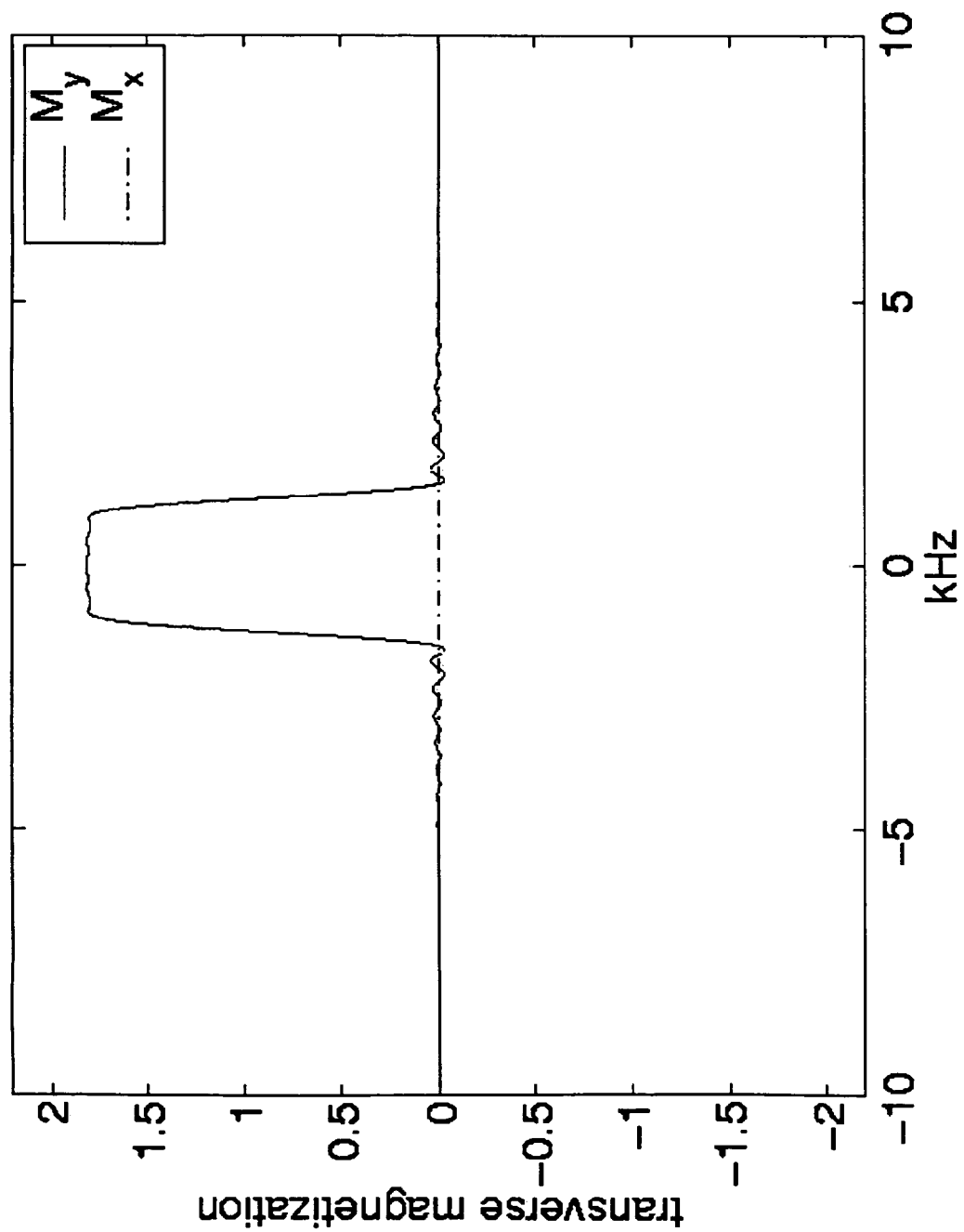
Figure 5C:
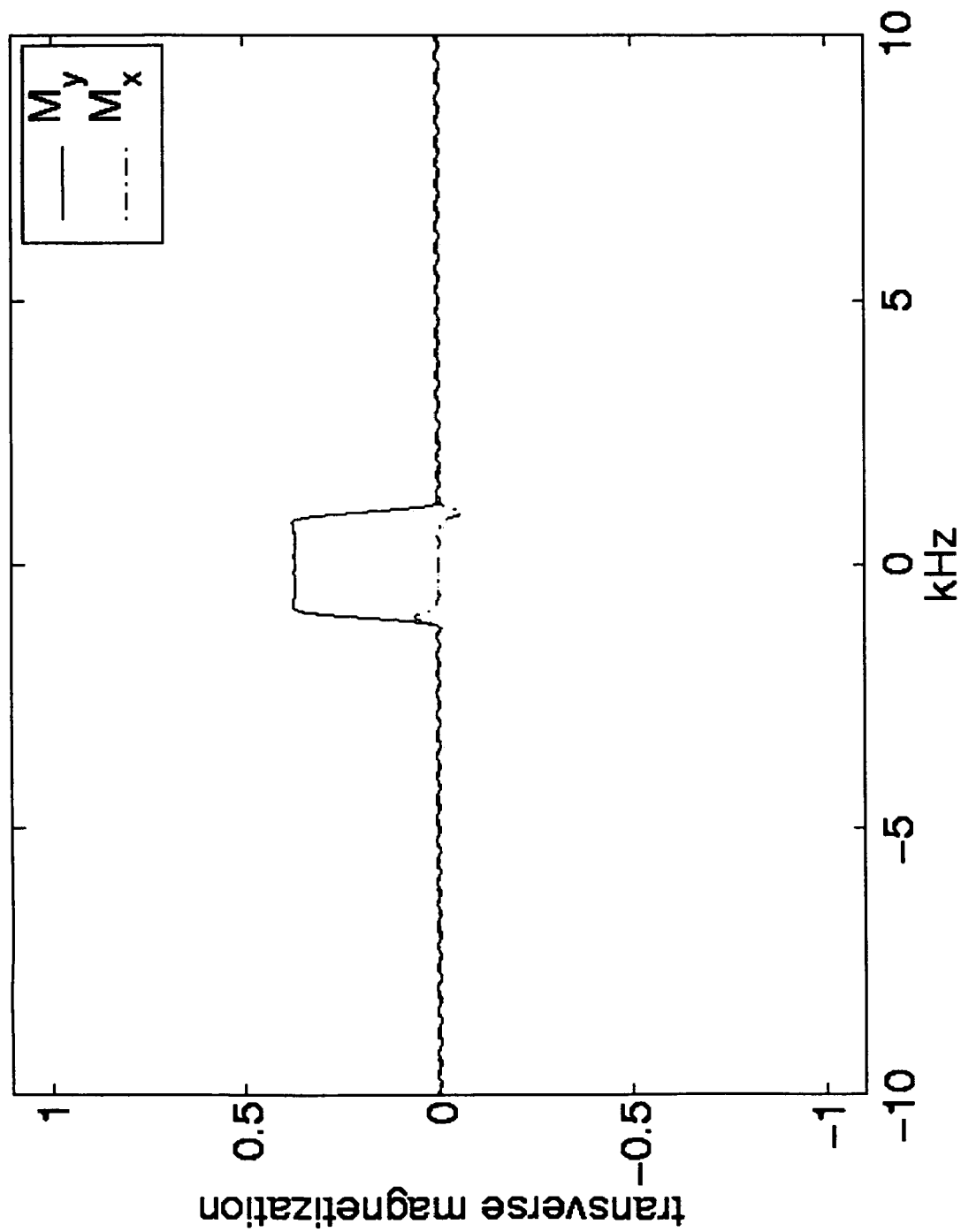

FIG. 5(c) shows the transverse magnetization produced by a minimum energy IST pulse, with a rephasing time of 2.5 ms, and $T_2$=5 ms, for comparison with FIGS. 3(c) and 4(c).

Figure 6A:
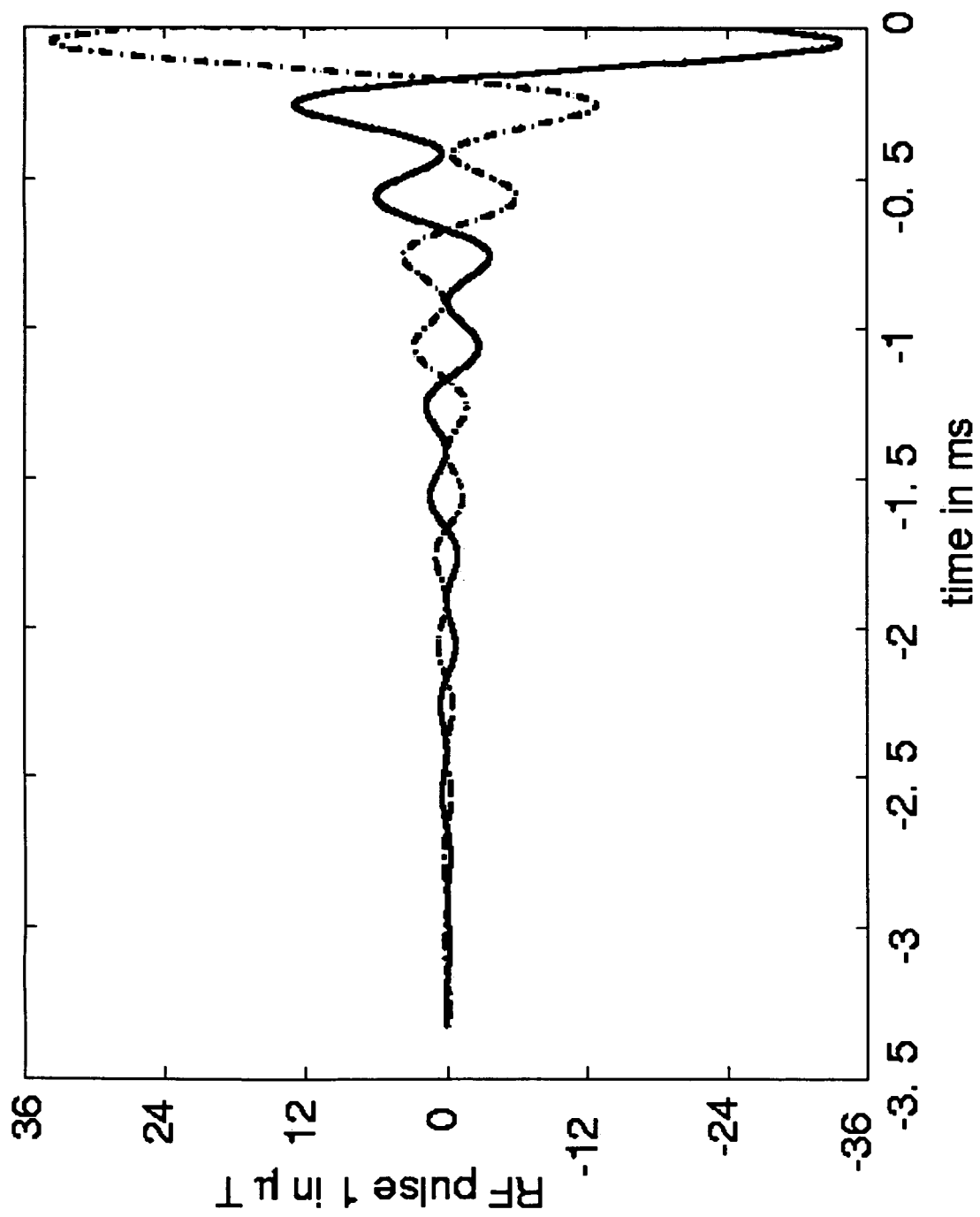
Figure 6B:
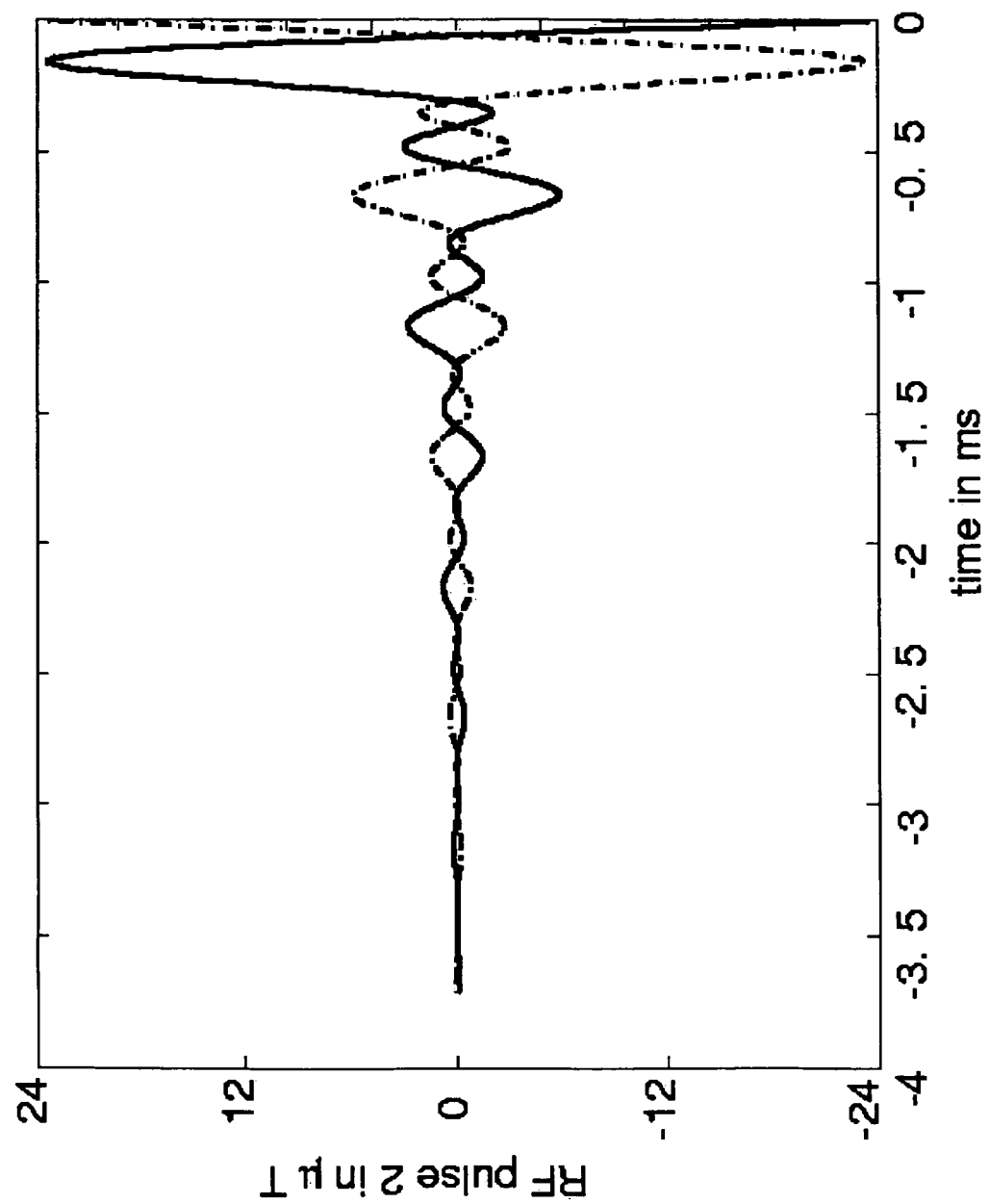

FIG. 6 illustrates an example with a non-constant phase target transverse profile, where (a) is pulse 1, (b) is pulse 2, (c) is the transverse magnetization produced by using the pulse in FIG. 6(a), (d) is the transverse magnetization produced by using the pulse in FIG. 6(b), and (e) is the summed transverse magnetization produced by using the pulse in FIGS. 6(a) and 6(b).

DETAILED DESCRIPTION OF ILLUSTRATIVE EMBODIMENTS

Half pulse synthesis as an inverse scattering problem

In U.S. patent application Ser. No. 10/734,799, a formalism was presented for analyzing pulse synthesis problems using the inverse scattering transform (IST). The contents of that application are hereby incorporated by reference in their entirety. One only requires a few facts, which are now presented. Given a magnetization profile, $m^\infty(\xi)$ the IST algorithm finds a pulse envelope q(t) which, after appropriate rephasing, produces the given profile. The parameter $$\xi = \frac{f}{2},$$

is the natural spin domain frequency parameter. The pulse synthesis problem is highly undetermined, and the IST actually allows one to specify an arbitrary number of auxiliary parameters. For definiteness, this preliminary discussion will focus on minimum energy pulses, which are uniquely determined by the magnetization profile. A detailed discussion of IST pulse synthesis can be found in the afore-mentioned patent application and the contents thereof are hereby incorporated by reference in its entirety.

Assuming the possibility of instantaneously switching the gradient fields, a pair of half pulses would be used in an MR-experiment as follows. With the slice select gradient turned on, the sample is first excited using the profile $q_1(t)$. At the conclusion of the excitation, the slice select gradient is immediately turned off, and the signal $S_1(t)$ is acquired. Once the system has returned to equilibrium, the slice select gradient is again turned on, but with the polarity reversed. The sample is excited using the profile $q_2(t)$. At the conclusion of this excitation the slice select gradient is again, immediately turned off, and the signal $S_2(t)$ is acquired. The goal of half pulse design is to have the summed signal, $S(t)=S_1(t)+S_2(t)$, equal to the signal that would have resulted if one had used a selective pulse with transverse profile $(m_x^s+im_y^s)(f)$.

The inventors have observed that the summed responses of the half pulses produce a result that may be even better than that obtained with a single excitation. With normalization in accordance with the method of the invention, the transverse profile produced by a single pulse is restricted to have a norm less than 1. Because it is the result of summing the signals from two such excitations, the norm of the summed profile (in Equation (1)) may be arbitrarily close to 2. For this reason, an admissible target transverse profile $(m_x^s+im_y^s)(f)$ is defined to be a function taking values in the disk of radius 2, rather than the disk of radius 1, as would be the case for the design of a single pulse. Using the half pulse technique, one can also increase the SNR by $\sqrt{2}$ since the summed signal has double the usual amplitude, while the noise is uncorrelated between the two half pulse excitations. Beyond this increase in SNR, the individual pulses $q_1(t)$ and $q_2(t)$ have large effective bandwidths and this tends to decrease their durations. This is a great virtue when imaging species with very short spin-spin relaxation rates. In light of the linearity of the measurement process, it is also clear that one can follow the excitations with phase, or frequency encoding steps, and the statement about the sum of the measured signals remains correct. Another way to achieve excitations that require no rephasing time is to use bound states to obtain self refocused 90° pulses, as described in the Rourke, et al. paper. For a given bandwidth in the summed profile, the standard self refocused pulses are considerably longer than the half pulses designed in accordance with the invention and have much larger maximum amplitudes.

In the afore-mentioned Epstein paper, a formalism is presented for analyzing pulse synthesis problems using the inverse scattering transform (IST). Only a few facts are required, which follow. Given a magnetization profile, which is a unit 3-vector valued function, $$m^\infty(\xi)=[m_x^\infty(\xi),m_y^\infty(\xi),m_z^\infty(\xi)],$$

the IST algorithm finds a pulse envelope q(t) which, after appropriate rephasing, produces the given profile. The parameter $$\xi = \frac{f}{2},$$

is the natural spin domain off-set frequency parameter. The pulse synthesis problem is highly underdetermiined, and the IST actually allows one to specify an arbitrary number of auxiliary parameters. For the moment, attention may be restricted to minimum energy pulses, which are uniquely determined by the magnetization profile. A detailed discussion of IST pulse synthesis can be found in the afore-mentioned Epstein paper, incorporated herein by reference.

In the inverse scattering formalism, the natural data for specifying the frequency response is the reflection coefficient, $r(\xi)$. If the pulse is supported in the interval $(-\infty, t_1]$, then the reflection coefficient is related to the magnetization profile by:

$$r(\xi) = \frac{(m_1^\infty(\xi) + im_2^\infty(\xi))e^{-2i\xi t_1}}{1 + m_3^\infty(\xi)}. \quad (2)$$

As noted above, the magnetization profile, $m^\infty(\xi)$, produced by a single pulse, is a unit vector valued function. In applications to MR, the reflection coefficient is usually supported in a bounded interval.

Supposing the gradient polarity is simply reversed, Equation (2) implies that a pulse supported in $(-\infty, t_1]$ requires $t_1$ units of rephasing time to achieve the specified magnetization profile, i.e., $m^\infty(\xi)$. This explains the remark above that a pulse supported in $(-\infty, 0]$ is a self refocused pulse in that it attains the specified magnetization profile without any need for rephasing. Using Equation (2), with $t_1=0$, one obtains the formula:

$$m_x^\infty(\xi) + im_y^\infty(\xi) = \frac{2r(\xi)}{1+|r(\xi)|^2}. \quad (3)$$

To simplify the notation, the following term is used: $m_{xy}(\xi) = m_x(\xi) + im_y(\xi)$. With this normalization, the transverse magnetization profile $m_{xy}\infty(\xi)$, produced by a single pulse, is a complex valued function, defined on the real line, taking values in the unit disk.

A minimum energy pulse is supported in $(-\infty, 0]$ if and only if its reflection coefficient $r(\xi)$ has an analytic extension to the upper half plane tending to zero as $|\xi|$ tends to infinity. More generally, a pulse is supported in $(-\infty, 0]$ if $r(\xi)$ has a meromorphic extension to the upper half plane tending to zero as $|\xi|$ tends to infinity, with finitely many poles, and these poles of $r(\xi)$ are used to define the bound states. With these preliminaries, one can recast the half pulse synthesis problem in terms of scattering data. In particular, given a transverse magnetization profile $m_{xy}^\infty(\xi)$, find a pair of reflection coefficients $(r_1(\xi), r_2(\xi))$ such that:
1. $r_1(\xi)$ and $r_2(\xi)$ have extensions to the upper half plane tending to zero as $|\xi|$ tends to infinity which are analytic or meromorphic with finitely many poles, and
2. For $\xi \in R$, They satisfy the equation:

$$\frac{2r_1(\xi)}{1+|r_1(\xi)|^2} + \frac{2r_2(-\xi)}{1+|r_2(-\xi)|^2} = m_{xy}^\infty(\xi). \quad (4)$$

For the half pulse problem, the input data is a summed transverse profile $m_{xy}^s(\xi)$, which is a complex valued function defined on the real line taking values in the disk of radius 2 centered at 0. The disk has radius 2 because $m_{xy}^s(\xi)$ is the result of summing two transverse profiles, each of which takes values in the disk of radius 1. If $|m_{xy}^s(\xi)|$ exceeds 1 at any point, then the given transverse magnetization can no longer be attained using a single pulse.

If $r_1(\xi), r_2(\xi)$ have analytic extensions to the upper half plane, then the corresponding minimum energy pulses $q_1(t)$, $q_2(t)$ with these reflection coefficients are supported in $(-\infty, 0]$, and therefore solve the half pulse synthesis problem. If $r_1(\xi)$ and $r_2(\xi)$ have meromorphic extensions to the upper half plane with finitely many nontrivial poles, then the poles of $r_1(\xi)$ and $r_2(\xi)$, respectively, are used to define bound states, in order to get potentials, supported in $(-\infty, 0]$, with these reflection coefficients.

An interesting special case arises when $m_{xy}^s(\xi)$ is real valued. In this case, there is, in essence, a single half pulse that solves the problem. That is, $q_1(t)$ can be taken to be the pulse defined by $r_1(\xi)$ (and its poles in the upper half plane, if necessary). One may then take $r_2(\xi) = r_1(-\xi^*)^*$. In this case Equation (4) becomes:

$$\frac{4 \operatorname{Re} r_1(\xi)}{1+|r_1(\xi)|^2} = m_{xy}^s(\xi). \quad (5)$$

Even when the data, $m_{xy}^s(\xi)$ are real, the solutions to Equation (5) are not. The phase of $r_1(\xi)$ is fairly complicated, and so it is necessary to use a method for obtaining the potential that respects the phase of the magnetization profile. In particular, the usual Shinnar-Le Roux or SLR-approach cannot easily be applied. In the usual implementations of SLR, the pulse is designed using the flip angle profile and the phase is "recovered." The half pulse synthesis problem is therefore a problem for which the IST approach to pulse synthesis is necessary. An exposition of a practical algorithm for implementing the IST-approach, with arbitrary bound states, is given in the afore-mentioned related patent application.

The Solution in the Real Case

If $m_{xy}^s(\xi)$ is real valued, then the half pulse design problem can be solved in closed form. Indeed the explicit formula provides an infinite dimensional space of solutions. These solutions have a simple formula in terms of the orthogonal projection $\Pi_+$ onto $L^2$-functions with an analytic extension to the upper half plane. This operator is defined in terms of the Fourier transform by $$\Pi_+ f(\xi) = \frac{1}{2\pi}\int_0^\infty \hat{f}(t)e^{it\xi} = \frac{1}{2}(f + \mathcal{H}f). \quad (6)$$

Here $\mathcal{H}$ is the Hilbert transform. As $\mathcal{H}$ a shift invariant filter, it can be efficiently implemented using the fast Fourier transform. If $$r_1(\xi) = \frac{1-s(\xi)}{1+s(\xi)}, \quad (7)$$

then Equation (5) becomes $$\frac{1-|s(\xi)|^2}{1+|s(\xi)|^2} = \frac{1}{2}m_{xy}^s(\xi). \quad (8)$$

There exists a solution, $s(\xi)$, to Equation (8) that has a nonvanishing analytic extension to the upper half plane. This solution is denoted by $s_0(\xi)$. Solving for $|s_0(\xi)|$:

$$|s_0(\xi)|^2 = \frac{2-m_{xy}^s(\xi)}{2+m_{xy}^s(\xi)}. \quad (9)$$

Given that $s_0(\xi)$ is analytic and nonvanishing in the upper half plane and tends to 1 as $|\xi|$ tends to infinity, knowledge of $|s_0(\xi)|$ can be used to completely determine $s_0(\xi)$. This idea is already used in an essential way in the derivation of the IST, as indicated by Equations (38) and (40) in the aforementioned Epstein paper. The projector $\Pi_+$ is used to solve for $\log s_0$ in terms of $\log |s_0|$. If $$\log s_0(\xi) = [\Pi_+ \log|s_0|](\xi) = \frac{1}{2}\Pi_+ \log\left[\frac{2-m_{xy}^s}{2+m_{xy}^s}\right](\xi) \text{ then} \quad (10)$$

$$s_0(\xi) = \exp\left[\frac{1}{2}\Pi_+\log\left[\frac{2-m_{xy}^s}{2+m_{xy}^s}\right](\xi)\right], \quad (11)$$

is a nonvanishing analytic function in the upper half plane, which satisfies Equation (8) on the real axis. If $m_{xy}^s(\xi)$ is integrable and has an integrable derivative, then $s_0(\xi)$ tends to 1 as $|\xi|$ tends to infinity.

Using Equations (7) and (10), one can easily solve for $r_1(\xi)$ in terms of $m_{xy}^s(\xi)$. This function is meromorphic in the upper half plane, tends to zero at infinity, and satisfies Equation (5). If $s(\xi) \neq -1$ for $\xi$ in the upper half plane, then $r_1(\xi)$ is analytic. This happens if, for example, $m_{xy}^s(\xi)$ is nonnegative, for then $|s_0(\xi)| \leq 1$ on the real axis, and so by the maximum principle, $s_0(\xi) \neq -1$ in the upper half plane.

The other solutions to Equation (8) may be obtained by multiplying $s_0(\xi)$ by a Blaschke product. Let $\zeta = \{\zeta_1, \ldots, \zeta_N\}$ be an arbitrary collection of points with $\text{Im}\zeta_j \neq 0$ for all j. The function defined by $$s_\zeta(\xi) = s_0(\xi) \prod_{j=1}^{N} \left( \frac{\xi - \zeta_j}{\xi - \overline{\zeta_j}} \right), \tag{12}$$

satisfies Equation (8) on the real axis and tends to 1 as $|\xi|$ tends to infinity in the closed upper half plane. The Blaschke product, or factor, is the product of rational functions appearing on the right hand side of Equation (12).

The functions $s_0(\xi)$ and $s_\zeta(\xi)$ are meromorphic in the upper half plane. Using Equation (7), $r_1(\xi)$ may be recovered from $s_0(\xi)$, or $s_\zeta(\xi)$. The reflection coefficient is also meromorphic in the upper half plane. If $r_1(\xi)$ has poles, then these poles must be included as bound states when the potential $q_1(t)$ is reconstructed from $r_1(\xi)$. This is necessary to ensure that $q_1(t)$ is supported in $(-\infty 0]$ and provides a further reason why the IST approach to pulse synthesis is needed to reconstruct the potential from the scattering data. It is not immediately evident which of the infinite dimensional space of possible half pulses has the minimum energy.

The following is a useful application of the Blaschke factor. Since $s_0(\xi)$ is asymptotically equal to 1, the transverse magnetization $$\frac{2r_1(\xi)}{1 + |r_1(\xi)|^2}$$

excited by the half-pulse tends to zero as $|\xi|$ tends to infinity. However, the imaginary part of this function may decay very slowly, which is undesirable in many applications. A method for improving the rate of decay is to choose $\zeta = \{i\eta\}$ where $\eta \in \mathbb{R}$, is chosen so that $$\lim_{|\xi| \to \infty} |\xi||s_\zeta(\xi) - 1| = 0. \tag{13}$$

By using more Blaschke factors, one can arrange to have $|1 - s_\zeta(\xi)|$ decay to zero as $|\xi| \to \infty$ at any polynomial rate.

The solution with general data

If $m_{xy}^s(\xi)$ is not real valued, then there are many possible algorithms for obtaining approximations to $(r_1(\xi), r_2(\xi))$ and thereby $(q_1,(t), q_2(t))$. The following is an algorithm that has successfully produced pulses, even for fairly large $m_{xy}^s(\xi)$, i.e., functions with sup-norm close to 2. The algorithm is described in terms of the orthogonal projection $\Pi_+$, described in Equation (6).

The two reflections coefficients must be found simultaneously. The linear solution is used to initialize the algorithm:

$$r_1^0(\xi) = \frac{1}{2}\Pi_+|m_{xy}^s(\xi)|, \quad r_2^0(\xi) = \frac{1}{2}\Pi_+|m_{xy}^s(-\xi)|. \tag{14}$$

The iteration given by:

$$r_1^{j+1}(\xi) = \Pi_+\left[\frac{(1+|r_1^j(\xi)|^2)}{2}\left(m_{xy}^s(\xi) - \frac{2r_2^j(-\xi)}{1+|r_2^j(-\xi)|^2}\right)\right] \tag{15}$$

$$r_2^{j+1}(\xi) = \Pi_+\left[\frac{(1+|r_2^j(\xi)|^2)}{2}\left(m_{xy}^s(\xi) - \frac{2r_1^j(-\xi)}{1+|r_1^j(-\xi)|^2}\right)\right].$$

The iterative step is repeated until the changes $$\Delta r_1^{j+1}(\xi) = r_1^{j+1}(\xi) - r_1^j(\xi), \quad \Delta r_2^{j+1}(\xi) = r_2^{j+1}(\xi) - r_2^j(\xi),$$

become sufficiently small. It is very likely that there is also an infinite dimensional space of solutions when $m_{xy}^s$ is complex valued.

Several examples of pulse pairs designed using these algorithms are provided below. As will be apparent, once the reflection coefficients are found using the techniques described above, the pulses are obtained using, for example, the algorithm for solving the inverse scattering problem as described in the aforementioned related patent application.

EXAMPLES

In this section, several examples are provided using the algorithms in Equations (10) and (15) to design pairs of half pulses. These equations are discretized and the solutions $r_1$, $r_2$ are found as finite Fourier series in $w = \exp(2i\Delta\xi)$. In effect, a hard pulse approximation is used. The potentials, $q_1(t)$, $q_2(t)$ are obtained from the reflection coefficients, $r_1(w)$, $r_2(w)$, using a modification of an algorithm given by Yagle in an article entitled "Inversion of the Bloch Transform in Magnetic Resonance Imaging Using Asymmetric Two Component Inverse Scattering," Inverse Problems, Vol. 6 (1990), pp. 133–151. The potentials could also be found using the algorithm in the aforementioned related application. The input to the modified Yagle algorithm is a reflection coefficient r, which is a rational function of w. It automatically uses all the poles of r within the unit disk to define bound states, without the necessity to locate them or compute the residues of $r(w)$ at these points. Each of these pulses took considerably less than a minute to compute on a 2GHz Linux® box, using a Matlab® program.

In the transverse profile plots referenced below, $m_x(f)$ is shown with a solid line and $m_y(f)$ is shown with a dot-dash line. The pulse plots are in the rotating reference frame. If $B_1(t) = e^{iw_0't}(b_{1x}(t) + ib_{1y}(t))$ then, in the plots, $b_{1x}(t)$ is shown as a solid line and $b_{1y}(t)$ as a dot-dash line.

Example 1

Figure 1A:
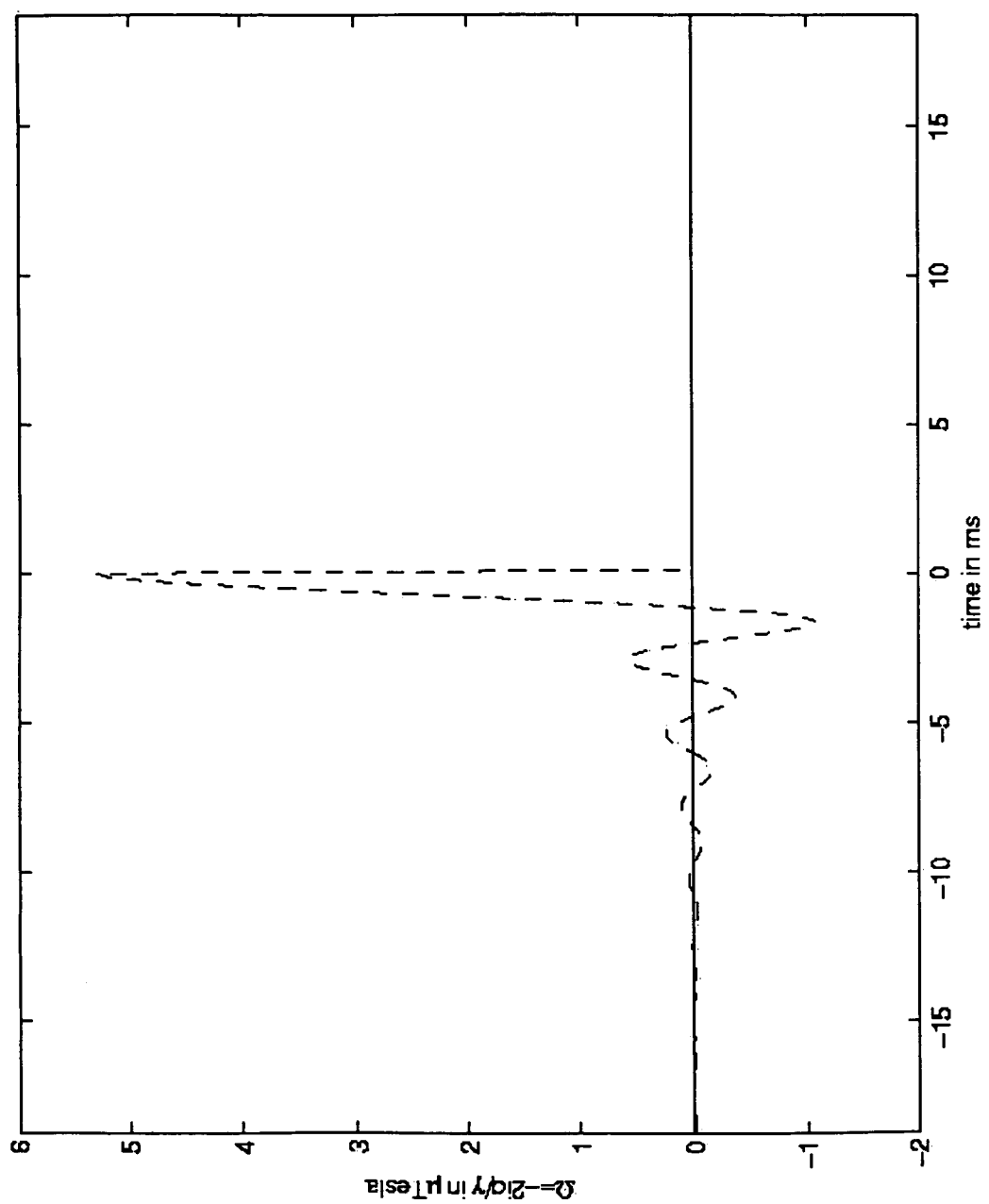
FIG. 1 illustrates the result of using the conventional linear approximation to design a pair of half pulses which sum to produce a 90° flip, where (a) is the pulse designed using the linear approximation and (b) is the summed transverse magnetization produced by using the pulse in FIG. 1(a) as a half pulse. Note that the maximum of the sum in FIG. 1(b) exceeds the design specification of 1.
Figure 1B:
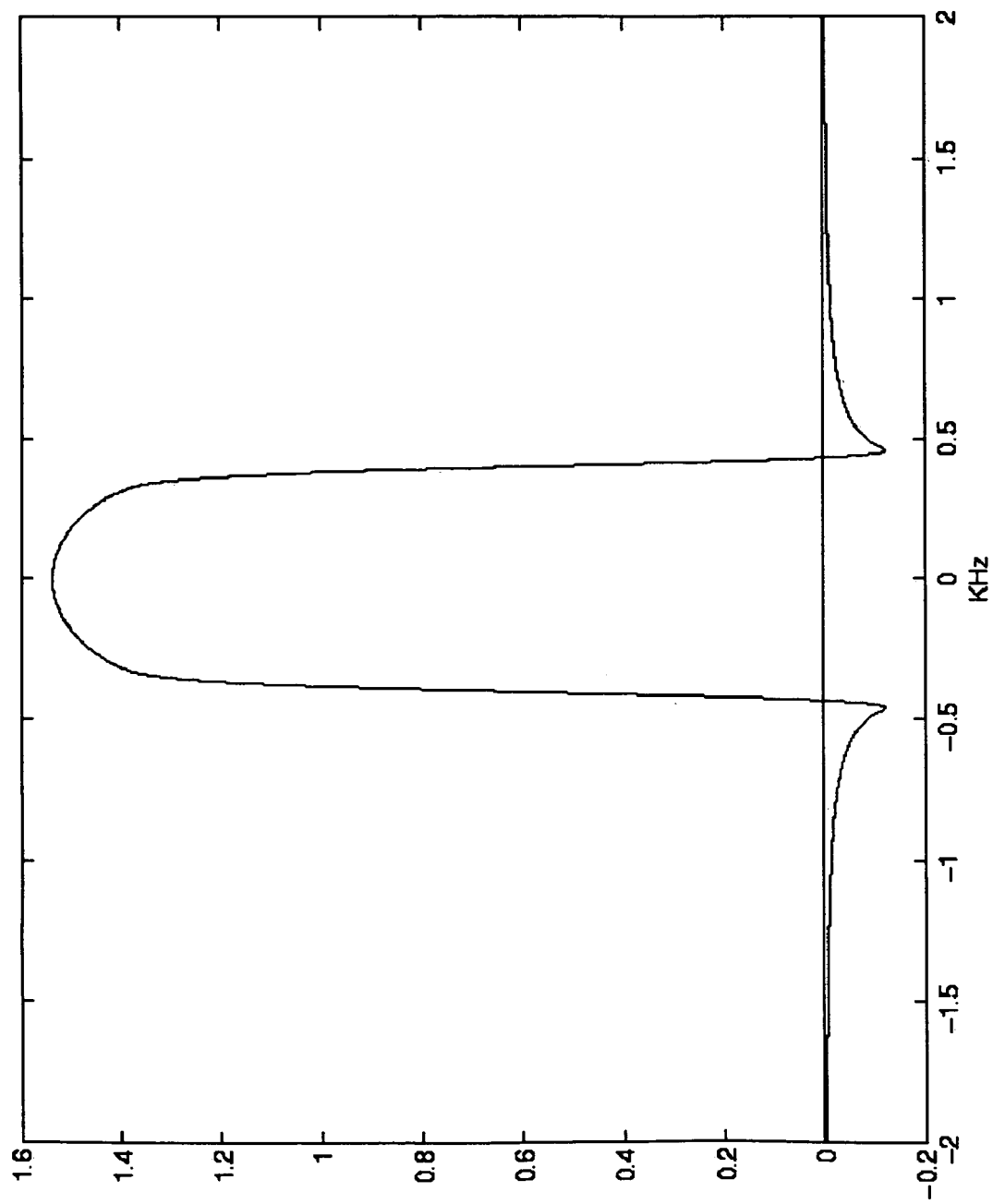
Figure 2A:
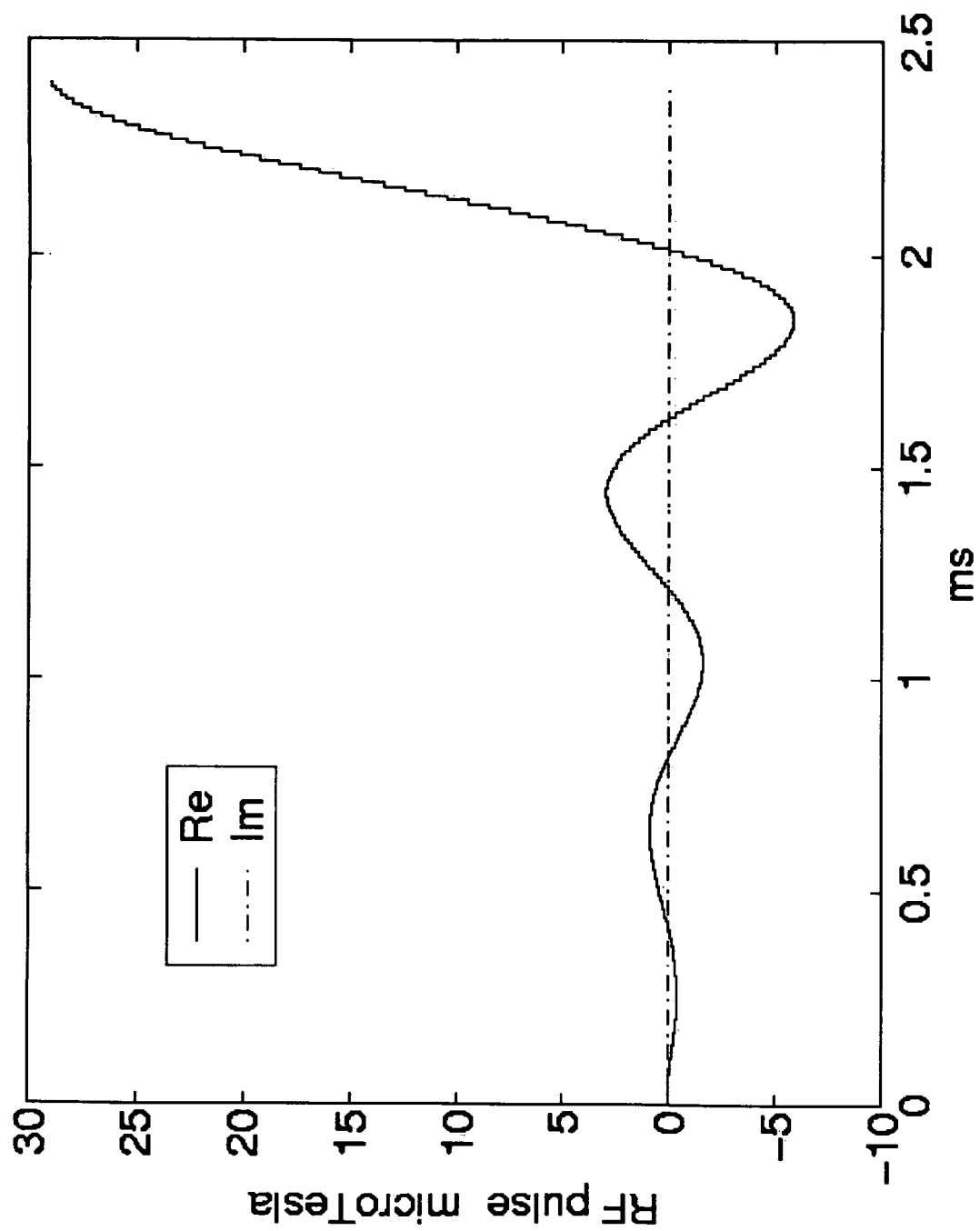
FIG. 2 illustrates the result of using the linear approximation to design a pair of half pulses which sum to produce the maximum possible in-slice signal, where (a) is the pulse designed using the linear approximation, (b) is the summed transverse magnetization produced by using the pulse in FIG. 2(a) as a half pulse, with $T_2=\infty$, and (c) is the summed transverse magnetization produced by using the pulse of FIG. 2(a) as a half pulse, with $T_2=5$ ms.
Figure 2B:
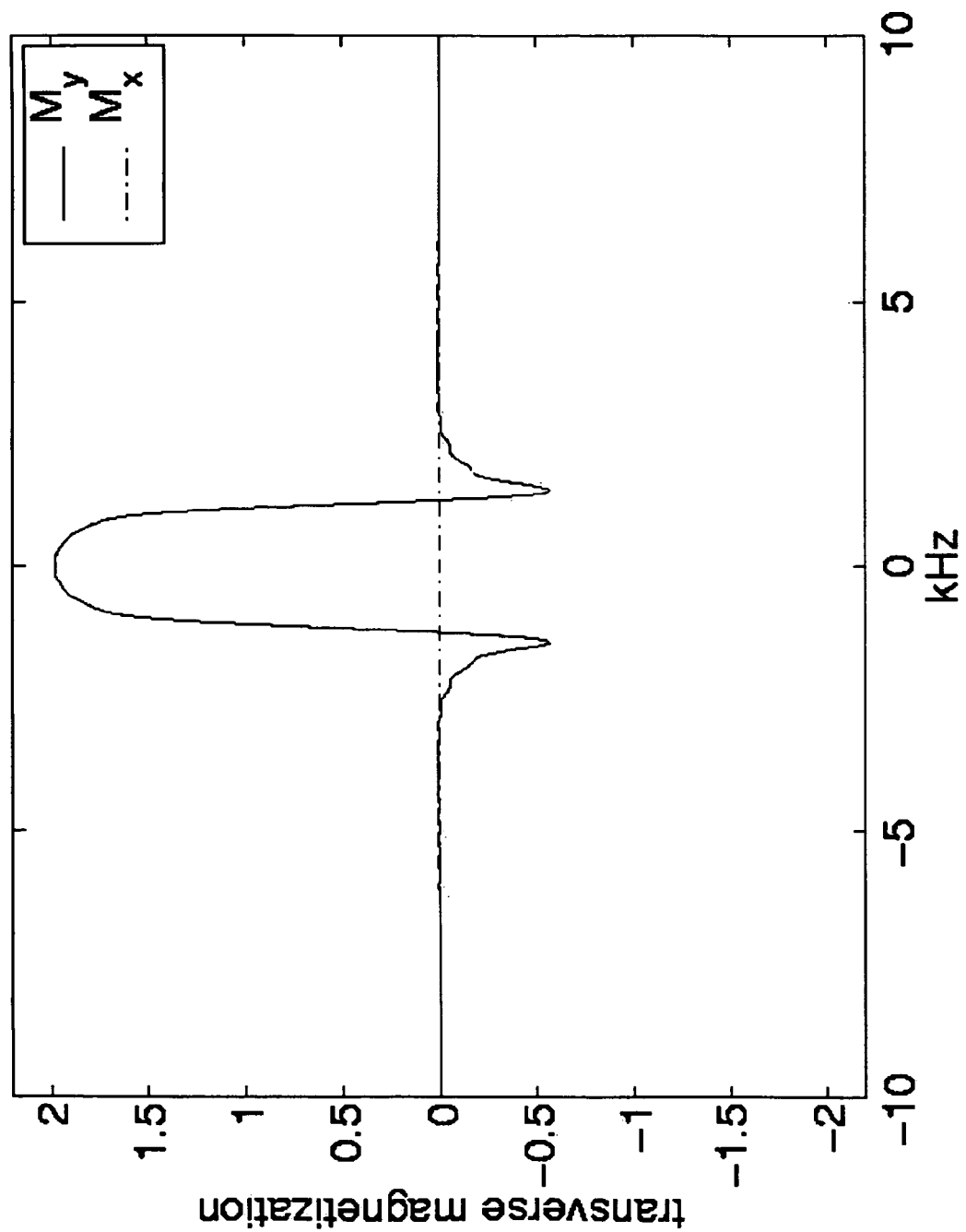
Figure 2C:
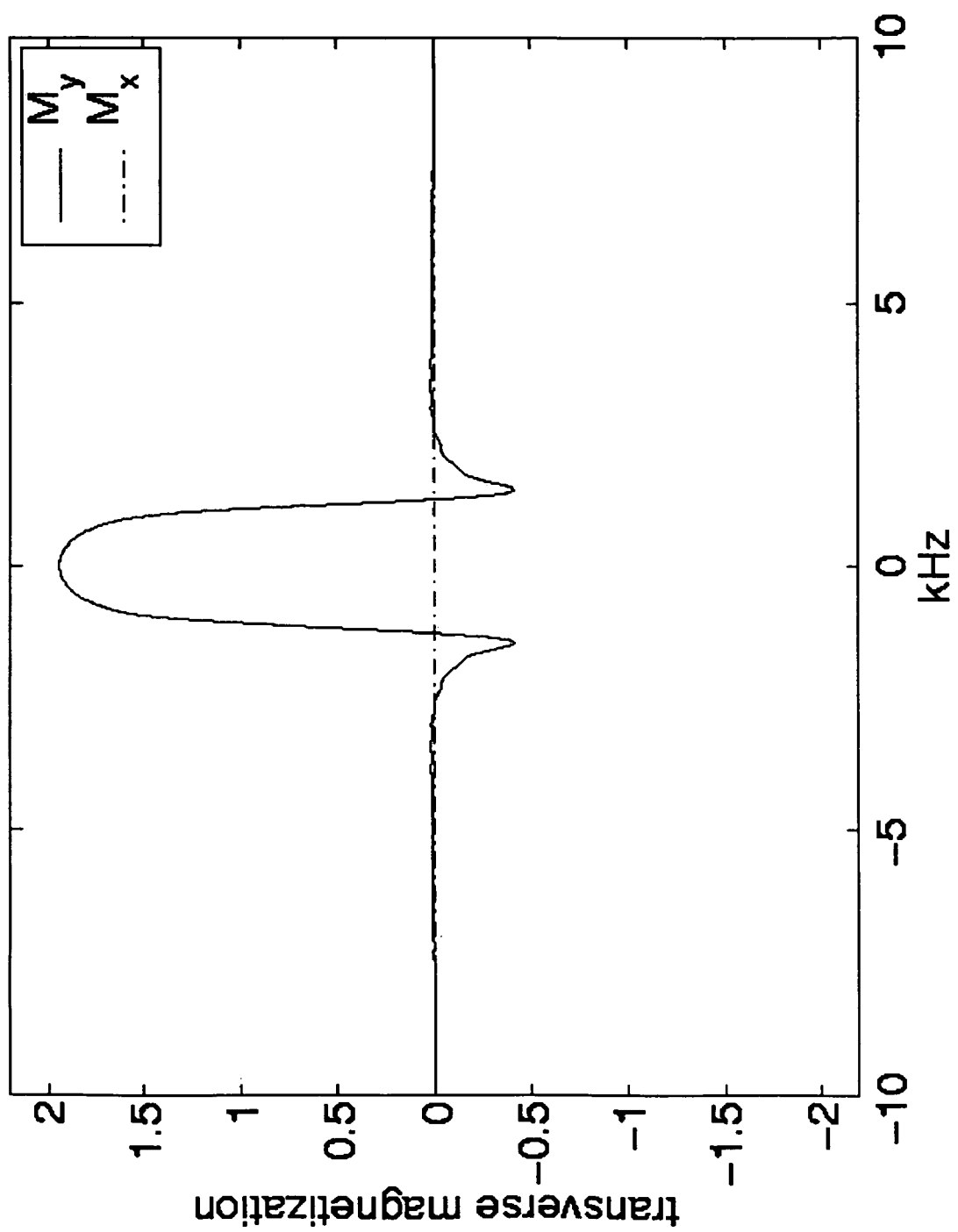

FIG. 2(a) shows a half pulse designed using the Fourier method to produce a summed transverse profile equal to 2 within the passband and 0 a little outside it. In FIG. 2(b) is shown the summed transverse profile produced by this pulse under "ideal" circumstances, i.e. $T_2 = \infty$. In FIG. 2(c) is shown the summed transverse profile produced by this pulse with $T_2=5$ ms. Under ideal conditions this pulse is not very selective and fails to achieve the maximum summed amplitude within most of the passband. Even with a short $T_2$, the transverse profile retains most of its amplitude and shape.

Example 2

The pulse in FIG. 3(a) is designed with the IST algorithm and Equation (10) to produce the summed transverse magnetization in-slice of 2 and essentially zero out of slice. In FIG. 3(b) is shown the summed transverse profile produced by this pulse under "ideal" circumstances, i.e. $T_2=\infty$. In FIG. 3(c) is shown the summed transverse profile produced by this pulse with $T_2=5$ ms. This pulse has somewhat larger maximum amplitude and equal duration to the previous example. Under ideal conditions, it is very selective and produces essentially the full amplitude in-slice. With a short $T_2$, the transverse profile again retains most of its amplitude and selectivity.

Example 3

In FIG. 5(a) is shown the transverse profile (not summed) produced by a single excitation using the pulse in FIG. 3(a) and in FIG. 5(b) that produced by a single excitation using the pulse in FIG. 4(a). The transverse profile has a very complicated phase relation, which needs to be respected in order to solve the half pulse synthesis problem. This is a reason why an implementation of the inverse scattering transform is desired to solve this type of pulse design problem. The transverse profile for the second pulse shows a much more rapidly decaying imaginary part.

Example 4

FIG. 5(c) shows the transverse profile produced by a minimum energy 90° pulse with the same bandwidth and transition region as that of the pulses in Examples 2 and 3. It has a duration of 5 ms and requires 2.5 ms of rephasing. For this simulation $T_2=5$ ms. If $T_2=\infty$, the in-slice transverse magnetization produced by this pulse has size 1. Comparing this plot to FIGS. 2–4(c), it is apparent that the transverse profile of the minimum energy pulse suffers much greater loss of amplitude than the summed amplitude produced by the half pulses.

Example 5

Figure 6C:
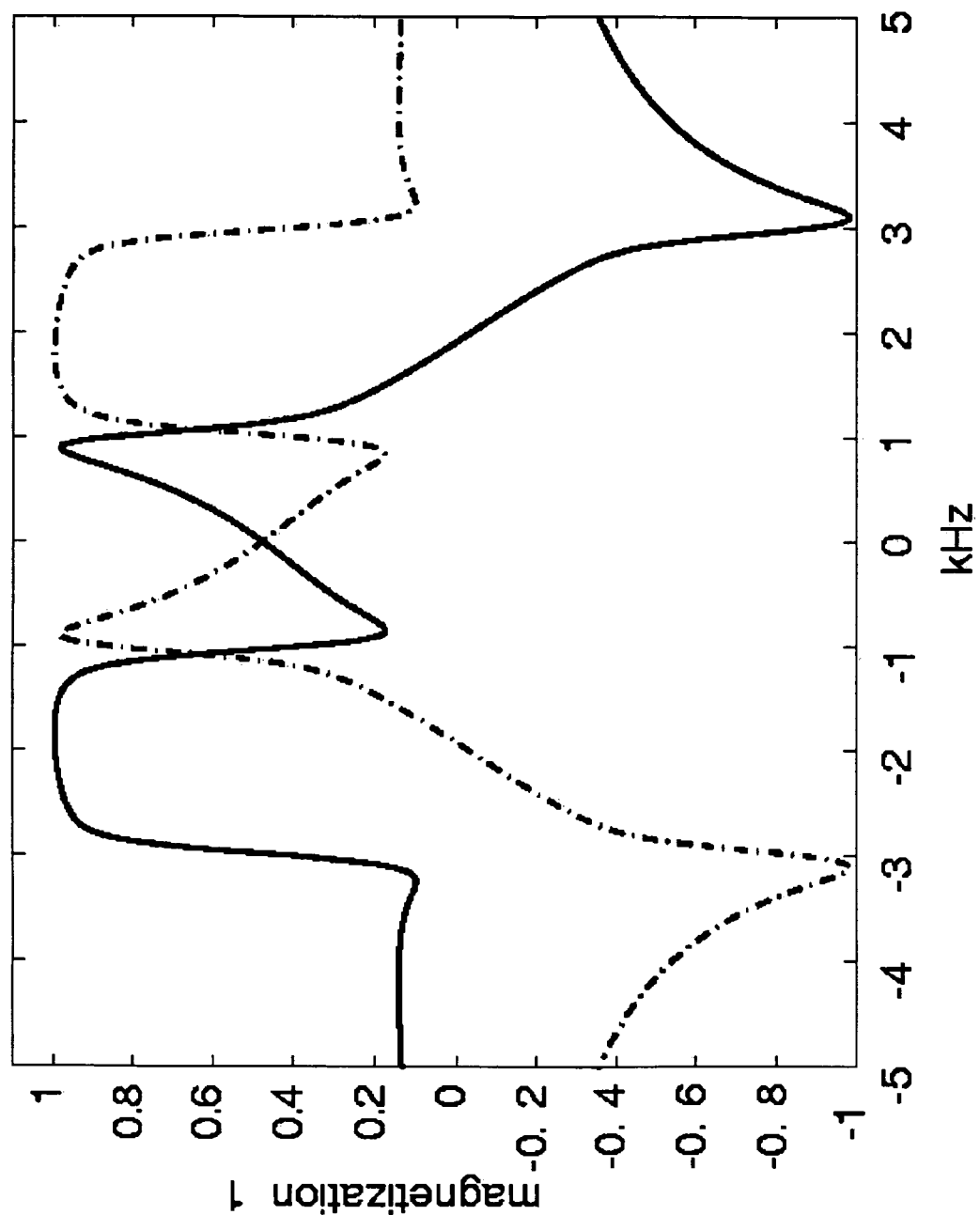
Figure 6D:
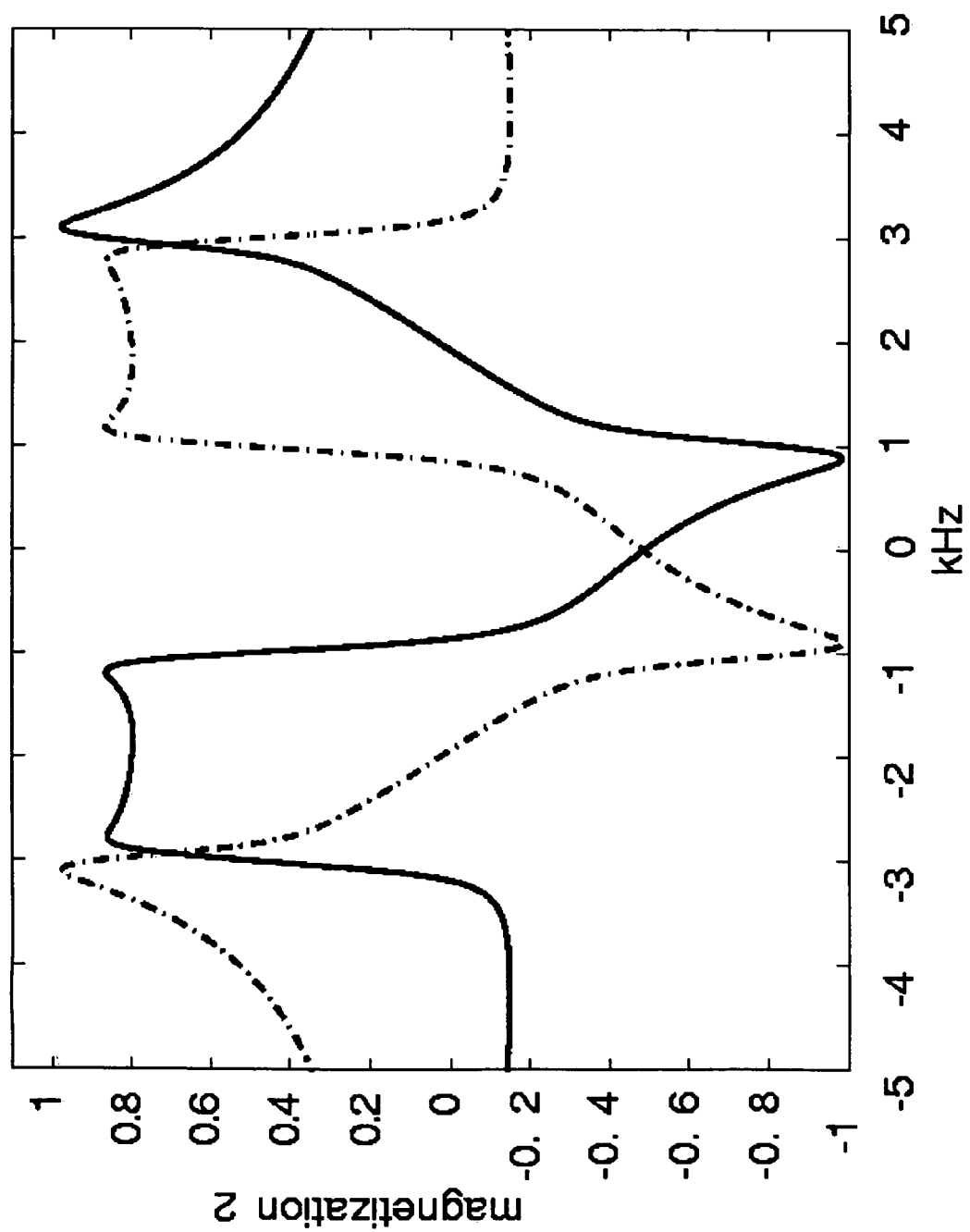
Figure 6E:
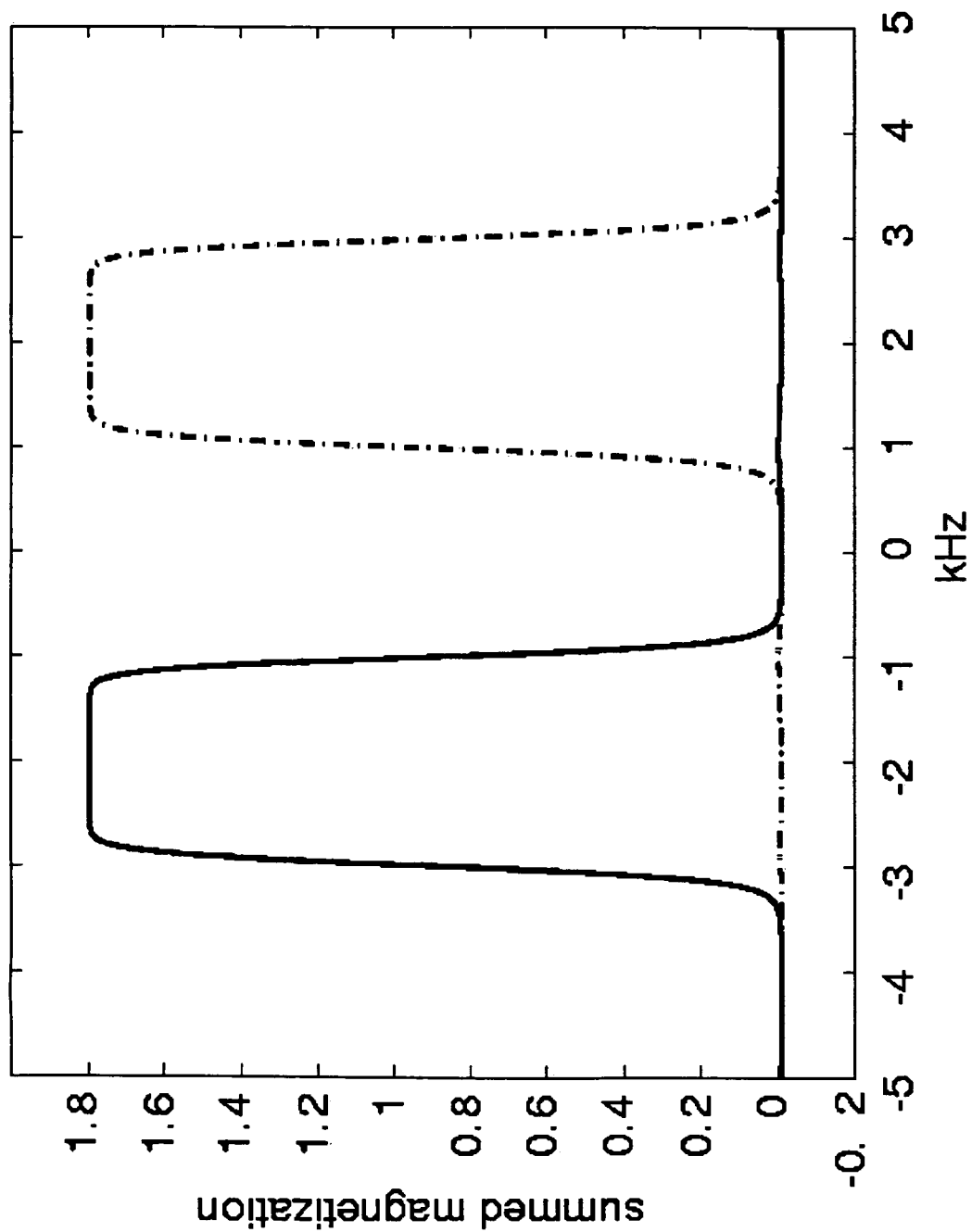

For the final example, a target magnetization is used with nontrivial real and imaginary parts. The target magnetization, shown in FIG. 6(e), has two passbands with the magnetizations 90° out of phase. The pair of half pulses, found using Equation (15), are shown in FIGS. 6(a) and 6(b). They both have nontrivial real and imaginary parts. The magnetizations produced by each pulse separately are shown in FIG. 6(c) and 6(d), respectively. The summed transverse magnetization is shown in FIG. 6(e). This pulse is intended to demonstrate the capabilities of the general algorithm; it is likely far too long to be used in applications where $T_2$ is very short.

Conclusion

It has been shown that the problem of half pulse design has a natural interpretation in the inverse scattering formalism. This interpretation leads to simple and efficient algorithms for the exact solution of the general half pulse design problem. In examples, it has been shown that, under ideal conditions, the sums of the outputs of the IST designed pulses achieve the specified target transverse profile to a very high degree of precision. With a short $T_2$ the summed profile retains its amplitude and general shape.

It has also been shown that, by using Blaschke factors with the nonlinear approach, the out-of-slice excitation can be dramatically reduced. As the IST approach gives an infinite dimensional space of solutions to the half pulse synthesis problem, it may be possible to choose the auxiliary parameters to ameliorate the problems that arise in the actual implementation of these pulses.

In Nielson, et. al. various practical difficulties with implementing half pulses in magnetic resonance hardware are discussed. For example, the finite ramp time of the gradient can be largely overcome using the VeRSE technique described by Conolly et al. in "Variable-rate selective excitation," J. Magn. Reson., Vol. 78 (1988), pp. 440–458. This can also be applied to the pulses obtained here. The pair of pulses produced by either the linear or nonlinear linear theory produce considerable excitation outside the desired slice. The selectivity of the pair of pulses results from delicate cancellations between the out of slice contributions from the two pulses. A variety of phenomena, such as eddy currents, can lead to imperfect cancellation out of slice, in the sum of the measured signals. The post-processing techniques described by Nielson et. al. can also be used with the pulses designed herein. As noted above, with sufficiently good experimental technique, the improvements in the designed profiles should be reflected in the profiles obtained on a scanner.

In addition, since the selective excitation is obtained as the sum of two independent excitations, the noise is uncorrelated between them. For a given summed signal strength, a $\sqrt{2}$ improvement in the signal-to-noise (SNR) ratio is thus obtained. One is also able to obtain a summed signal strength arbitrarily close to the theoretical (normalized) maximum of 2.

What is claimed is:

1. A method of synthesizing a pair of self refocused waveforms whose resultant excitations when summed together provide a target transverse profile, comprising the steps of:
   determining first and second magnetization profiles each of which is producible by a self refocused pulse, where, at any given frequency, the sum of (a) the transverse part of the first magnetization profile and (b) the transverse part of the second magnetization profile at a frequency of opposite sign to the frequency of the first magnetization profile, gives the target transverse profile at the given frequency; and
   obtaining the pair of self refocused waveforms that respectively produce the first and second magnetization profiles determined in the magnetization profiles determining step.

2. The method of claim 1, wherein said target transverse profile comprises any complex valued function on the real line with constant phase, modulo 180°, of modulus less than 2, and sufficiently rapid decay for applications including at least one of magnetic resonance imaging and NMR spectroscopy.

3. The method of claim 2, wherein a plurality of said first and second magnetization profiles, producible by self refocused pulses, are found using:

$$r_1(\xi) = \frac{1-s(\xi)}{1+s(\xi)},$$

where $$\xi = \frac{f}{2}$$

is a natural spin domain off-set frequency parameter, $r_1$ is a reflection coefficient in the upper half plane, and $s(\xi)$ is a solution that has a meromorphic extension to the upper half plane and tends to 1 as $|\xi|$ tends to infinity.

4. The method of claim 1, wherein said target transverse profile comprises any complex valued function on the real line with modulus less than 2 and sufficiently rapid decay for applications including at least one of magnetic resonance imaging and NMR spectroscopy.

5. The method of claim 4, wherein said first and second magnetization profiles are produced by approximating reflection coefficients for the first and second magnetization profiles using iterations of a linear solution for the reflection coefficients until changes in the reflection coefficients become sufficiently small.

6. The method of claim 1, comprising the further step of obtaining a plurality of solutions to an inverse scattering transform corresponding to an infinite dimensional space of half pulses for admissible constant phase (modulo 180°) target transverse pulses.

7. A method of synthesizing a pair of self refocused waveforms whose resultant excitations when summed together provide a target transverse profile, comprising the steps of:
    finding a pair of reflection coefficients and bound state data that correspond to the half pulses whose excitations sum together to provide the target transverse profile;
    using the found reflection coefficients and bound state data to find the two self refocused half pulses using an inverse scattering transform; and
    generating the found two self refocused half pulses.

8. The method of claim 7, comprising the further step of applying said two self refocused half pulses to a magnetic resonance imaging system to image species or measure spectra of species with a rapid spin-spin relaxation rate.

9. A method of generating magnetic resonance imaging signals, comprising:
    synthesizing a pair of self refocused waveforms for a target transverse profile, comprising the steps of determining first and second magnetization profiles each of which is producible by a self refocused pulse, where, at any given frequency, the sum of (a) the transverse part of the first magnetization profile and (b) the transverse part of the second magnetization profile at a frequency of opposite sign to the frequency of the first magnetization profile, gives the target transverse profile at the given frequency, and obtaining the pair of self refocused waveforms that respectively produce the first and second magnetization profiles determined in the magnetization profiles determining step; and
    applying the pair of self refocused waveforms synthesized in the synthesizing step to a magnetic resonance imaging system for creating magnetization profiles so as to obtain an arbitrary, admissible transverse magnetization profile as the summed response of two self refocused selective "half pulse" excitations.

10. The method of claim 9, wherein said target transverse profile comprises any complex valued function on the real line with constant phase, modulo 180°, of modulus less than 2, and sufficiently rapid decay for applications including at least one of magnetic resonance imaging and NMR spectroscopy.

11. The method of claim 10, wherein a plurality of said first and second magnetization profiles, producible by self refocused pulses, are found using:

$$r_1(\xi) = \frac{1-s(\xi)}{1+s(\xi)},$$

where $$\xi = \frac{f}{2}$$

is a natural spin domain off-set frequency parameter, $r_1$ is a reflection coefficient in the upper half plane, and $s(\xi)$ is a solution that has a meromorphic extension to the upper half plane and tends to 1 as $|\xi|$ tends to infinity.

12. The method of claim 9, wherein said target transverse profile comprises any complex valued function on the real line with modulus less than 2 and sufficiently rapid decay for applications including at least one of magnetic resonance imaging and NMR spectroscopy.

13. The method of claim 12, wherein said first and second magnetization profiles are produced by approximating reflection coefficients for the first and second magnetization profiles using iterations of a linear solution for the reflection coefficients until changes in the reflection coefficients become sufficiently small.

14. The method of claim 9, comprising the further step of obtaining a plurality of solutions to an inverse scattering transform corresponding to an infinite dimensional space of half pulses for admissible constant phase (modulo 180°) target transverse pulses.

* * * * *